United States Patent
Ratzlaff

(10) Patent No.: US 7,155,691 B2
(45) Date of Patent: Dec. 26, 2006

(54) APPARATUS AND METHODS FOR COMPILED STATIC TIMING ANALYSIS

(75) Inventor: Curtis Ratzlaff, Austin, TX (US)

(73) Assignee: Nascentric, Inc., Austin, TX (US)

( * ) Notice: Subject to any disclaimer, the term of this patent is extended or adjusted under 35 U.S.C. 154(b) by 208 days.

(21) Appl. No.: 10/862,018

(22) Filed: Jun. 4, 2004

(65) Prior Publication Data

US 2004/0255257 A1 Dec. 16, 2004

Related U.S. Application Data

(60) Provisional application No. 60/476,791, filed on Jun. 6, 2003.

(51) Int. Cl.
*G06F 17/50* (2006.01)
(52) U.S. Cl. ............................. 716/6; 703/19
(58) Field of Classification Search ............ 716/6, 716/4; 703/19
See application file for complete search history.

(56) References Cited

U.S. PATENT DOCUMENTS

| | | | |
|---|---|---|---|
| 5,191,541 A | | 3/1993 | Landman et al. |
| 5,379,231 A | | 1/1995 | Pillage et al. |
| 5,452,225 A | * | 9/1995 | Hammer ............... 703/19 |
| 5,771,375 A | | 6/1998 | Mains |
| 5,946,475 A | | 8/1999 | Burks et al. |
| 6,487,705 B1 | * | 11/2002 | Roethig et al. ........... 716/6 |
| 6,516,453 B1 | * | 2/2003 | Knapp ................ 716/6 |
| 6,766,506 B1 | | 7/2004 | Ratzlaff et al. |
| 6,925,621 B1 | * | 8/2005 | Mielke et al. ............ 716/6 |
| 7,000,206 B1 | * | 2/2006 | Kidd et al. ............. 716/6 |
| 2003/0177455 A1 | * | 9/2003 | Kaufman et al. ........... 716/2 |
| 2003/0182098 A1 | * | 9/2003 | Ehrler ................ 703/19 |
| 2004/0078767 A1 | * | 4/2004 | Burks et al. ............. 716/8 |

OTHER PUBLICATIONS

Ratzlaff et al., "RICE: Rapid Interconnect Circuit Evaluator", 28th ACM/IEEE Design Automation Conference, 1991 pp. 555-560.*
Synopsys, "Static Timing and Signal Integrity Sign-Off Analysis: Prime Time", 7 pages, Oct. 13, 1997.
Alexander Chatzigeorgiou, et al., "A Modeling Technique for CMOS Gates," IEEE Transactions on Computer-Aided Design of Integrated Circuits and Systems, vol. 18, No. 5, May 1999, pp. 557-575.
Noriya Kobayashi, et al., "Delay Abstraction in Combinational Logic Circuits," IEEE Transactions on Computer-Aided Design of Integrated Circuits and Systems, vol. 16, No. 10, Oct. 1997, pp. 1205-1212.
Curtis L. Ratzlaff, et al., "Modeling the RC-Interconnect Effects in a Hierarchical Timing Analyzer", IEEE, 1992, 4 pages.
Curtis L. Ratzlaff, et al., "RICE: Rapid Interconnect Circuit Evaluation Using AWE", IEEE, 1994, pp. 763-776.

* cited by examiner

*Primary Examiner*—Paul Dinh
*Assistant Examiner*—Suchin Parihar
(74) *Attorney, Agent, or Firm*—Lawrence J. Merkerl; Meyertons, Hood, Kivlin, Kowert & Goetzel, P.C.

(57) ABSTRACT

A system for analyzing an electronic circuit includes a computer. The computer obtains a description of the electronic circuit. The computer further analyzes the electronic circuit by using compiled static timing analysis (CSTA). Specifically, in one embodiment, the computer is configured to compile a timing model for the circuit responsive to the description of the circuit. The timing model comprises a description of a timing path and a description of an algorithm to evaluate the timing path. The computer is further configured to analyze a design that includes the circuit, wherein the analyzing comprises evaluating the timing model, and wherein evaluating the timing model comprises performing the algorithm to evaluate the timing path.

16 Claims, 20 Drawing Sheets

| 7 | 6 | 5 | 4 | 3 | 2 | 1 | 0 |
|---|---|---|---|---|---|---|---|
| REPEAT Count | | | | Post1 | Post0 | Pre1 | Pre0 |

0 = do nothing, >1 (up to 15) means
to evaluate specified number of arcs

Post Op
00 = no op
01 = store
10 = update
11 = push

Pre Op
00 = no op
01 = load
10 = peek
11 = pop

FIG. 10

APPARATUS AND METHODS FOR COMPILED STATIC TIMING ANALYSIS

CROSS-REFERENCE TO RELATED APPLICATIONS

This application claims priority to, and incorporates by reference, Provisional U.S. Patent Application Ser. No. 60/476,791, filed on Jun. 6, 2003, titled "Apparatus and Methods for Compiled Static Timing Analysis.

TECHNICAL FIELD

The inventive concepts relate generally to analysis of electronic circuits and, more particularly, to apparatus and methods for compiled static timing analysis (CSTA) of electronic circuitry.

BACKGROUND

Static timing analysis (STA) is a technique for analyzing a circuit's timing behavior. Static timing analysis allows a circuit's designer to predict the overall bounds for the timing behavior of a circuit. Although static timing analysis provides speed and convenience (to the user) advantages over circuit simulation techniques, it can still present a relatively complex overall design to the user. A need therefore exists for circuit analysis techniques that provide relatively high speeds and efficiency and yet present relatively low complexity to the user.

SUMMARY

One aspect of the invention relate to systems for analyzing electronic circuits. In one embodiment, a system for analyzing a circuit includes a computer. The computer is configured to obtain a description of the circuit, and analyze the circuit by using compiled static timing analysis (CSTA).

Another aspect of the invention relates to computer program products that include a computer application. In one embodiment, a computer application is adapted for processing by a computer. The application causes the computer to obtain a description of the circuit, and to analyze the circuit by using compiled static timing analysis (CSTA).

Yet another aspect of the invention relates to methods of analyzing an electronic circuit. In one embodiment, a method for analyzing a circuit includes obtaining a description of the circuit, and analyzing the circuit by using compiled static timing analysis (CSTA).

BRIEF DESCRIPTION OF THE DRAWINGS

The appended drawings illustrate only exemplary embodiments of the invention and therefore should not be considered as limiting its scope. Persons of ordinary skill in the art who have the benefit of the description of the invention appreciate that the disclosed inventive concepts lend themselves to other equally effective embodiments. In the drawings, the same numeral designators or labels used in more than one drawing denote the same, similar, or equivalent functionality, components, or blocks.

FIG. 10 shows an example of directive mapping.

DETAILED DESCRIPTION

Figure 1:
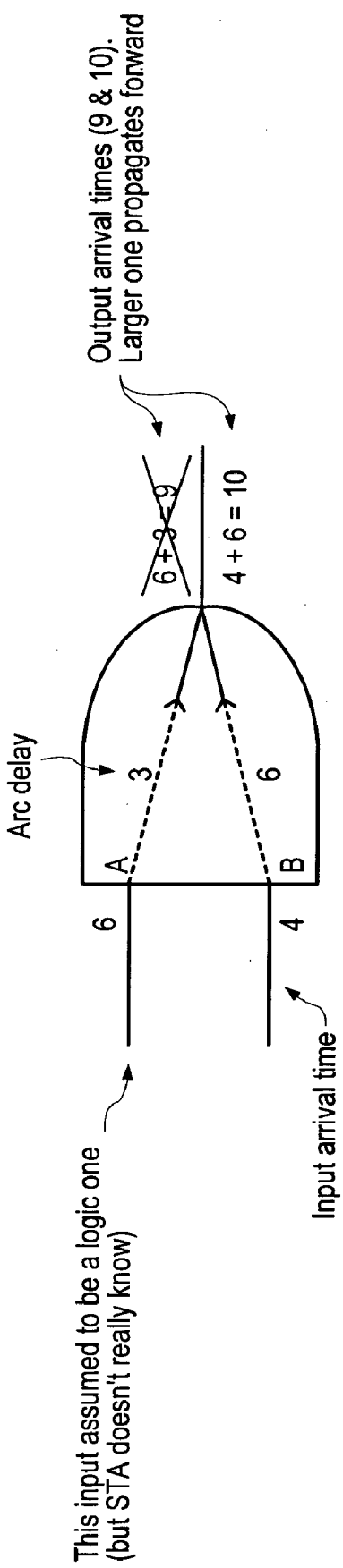
FIG. 1 shows an example of delay calculations for a single gate (an AND gate).

The inventive concepts contemplate apparatus and associated methods for compiled static analysis (CSTA). Compiled Static Timing Analysis is a specialized implementation of static timing analysis (STA). CSTA has several advantages over conventional approaches such as STA. For example, CSTA increases overall runtime performance and reduces memory storage specifications or requirements over traditional implementations of STA. However, those are not the only desirable benefits of this method. CSTA also lends itself to the creation of fast, compact, and reusable static timing models that may be employed in a hierarchical manner. The following description and accompanying figures make apparent to a person of ordinary skill in the art other advantages of disclosed CSTA.

Timing analysis and timing simulation are distinctly different methods of analyzing a digital logic circuit to predict its overall operating speed and/or the speed of certain sub-functions or sub-circuits of the circuit. For example, for a microprocessor (such a Intel's Pentium processor) that is being designed for mass production, it is very important for the design team to predict the worst-case (slowest) operating speed of the unit before it makes it to the production line, otherwise the result could be disastrous. Since this is done before the unit is produced or prototyped, software should be used that can analyze the design and predict its operating speed.

There are two primary ways to analyze the timing behavior of a circuit. The first method that emerged was timing simulation. Timing simulation is a dynamic method of predicting circuit behavior. The timing simulation software assumes that stimulus vectors are applied to the circuit inputs. A stimulus vector is merely a set of digital signals applied to the inputs of the circuit in a predetermined sequence. In doing so, the software logically propagates the signals throughout the circuit, thereby simulating the true behavior. Signals arrive at the various circuit elements in the circuits at times determined by the intrinsic delays of the various logic elements.

Timing simulation is a well-accepted method for relatively small logic circuits, but with circuit sizes now in the millions of logic gates, the selection of meaningful input vectors has become practically impossible. Even if all meaningful vectors could be found, it would take multiple lifetimes to simulate and analyze all of them.

STA was developed to reduce the effort and time to analyze a circuit's timing behavior. However, as the name implies, it predicts the timing characteristics without considering the dynamic effects of the circuit. In this case, a designer cannot track the propagation of specific signals through the circuit to observe the dynamic interactions of those signals. Sometimes, an understanding of these dynamic interactions is a prerequisite to resolving difficult problems in the design.

STA's primary advantage over simulation is its speed and ease-of-use. No stimulus vectors are required. All the designer has to do is to define the clock speed and set the expected arrival times of the inputs. There is no need to formulate thousands or tens of thousands of input vectors. Instead of taking days to run an analysis, one can be completed in minutes or hours. Furthermore, in basic STA, there is no need to provide the logical functions of each logic element to the STA software, again improving ease-of-use.

STA predicts the overall worst-case (WC) or best-case (BC) time-delay between any point and all other reachable points within a predetermined clock cycle. This implies that STA can be used only on synchronous logic circuits or on combinational logic circuits whose operation is implicitly synchronized by some clock. The description here considers the analysis of synchronous logic circuits described at the gate level or higher. In other words, it does not consider performing the explicit analysis of circuits described at lower levels of abstraction, such as the transistor level, nor does it consider the analysis of asynchronous circuits.

Although STA can predict the (time) delay between any two points in a logic circuit, it is normally used to predict the delay of a path or set of paths known as the critical path (sometimes called the longest path). A timing path between two points within a circuit is defined by a set of logic elements through which a logic signal propagates and by the path(s) within each element through which the signal travels to get from an input of the element to an output of the same element.

For a worst-case analysis, this path (or paths) is that with the maximum delay that determines the maximum operating speed of the circuit. Furthermore, any useful STA will perform a back-trace of the critical path to identify all logic elements that contribute to the overall path.

The path(s) within each logic element are often referred to as timing arcs. A timing arc is merely a logical path a signal might traverse to get from an element's input to an output. There is no guarantee a signal will traverse from the input to the output of an element unless other input(s) of that element are sensitized to allow it. For instance, FIG. 1 shows an example of delay calculations for a single gate, in this case, an AND gate.

Each input is assumed be set to a logic level (logic one in this case) to allow the other signal to propagate through to the output. Unless explicit information is provided to the STA, it assumes that propagation from any input of an element to any dependent output is possible.

Ignoring the different types of input transitions (high-to-low and low-to-high), the AND gate in FIG. 1 has two arcs, one from each input to its output. During analysis, the STA calculates the delay of the arc (based on various parameters discussed later) and adds it to the arrival time of the arc's input. It does the same for the other arc. This produces two new arrival times for the output of the gate, however only one of the arrival times is propagated to the next level. For a worst-case analysis, the maximum of the two is propagated. FIG. 1 shows the smaller one crossed out to indicate that it is discarded.

From a conceptual point of view, there is little difference to the STA whether a worst-case or best-case analysis is performed. In fact, some STAs perform them simultaneously. The algorithms are essentially identical. Therefore, without loss of generality, the worst-case scenario is considered here.

Because the STA does not necessarily consider the logic function of an element, then some other means may be or should be used to describe what output(s) of the element are dependent upon which inputs. Furthermore, the STA should know how to calculate the delay from each input to the dependent outputs. The "how" is associated with a delay calculation algorithm. Generally, this algorithm uses certain parameters—such as input slew and output load capacitance—to compute the delay.

This information is conveyed to the STA in the form of a timing model. The timing model enumerates all potential input-output dependencies. A combination of data and/or algorithms for each dependency allows the STA to compute the delay. Each of these input-to-output combinations constitutes a timing arc.

Traditional STA's embed the algorithmic portion of the timing model within the STA itself. CSTA depends upon this algorithm being embedded directly within the model itself. This implies that these timing models are executable entities.

The timing arc is the fundamental component of a timing path. In fact, once the timing arcs are known, the STA should not need any additional information about the circuit, except where structural information is to be conveyed to the users (e.g., the pin names of devices, names of nets, connectivity information). In CSTA, the structural information of the logic elements can be discarded, since the internal structure of the logic circuit is intentionally hidden. The hiding of this information is generally desired, since one of the purposes of using a model versus the entire circuit is to decrease the apparent complexity of the overall design (the design in which the compiled model is used). This information hiding is one of the features of CSTA.

A timing arc predicts the delay from a single switching input of a logical element to a switching output of the same element. This act of prediction will be referred to as arc evaluation. At a minimum, arc evaluation produces a numerical value that represents the intrinsic signal delay from the input (pin) of the arc to the output (pin) of the arc. The evaluation may be as trivial as merely returning a constant delay value, or it may be as complicated as having another computer system perform the computation. In either case, the complexity of initiating the computation is the same. Other than runtime efficiency, CSTA does not distinguish between the two.

Most often, the arc's delay depends upon one or more local parameters. In most STA's today, these parameters are the input transition time ($t_{in}$) and the output pin load capacitance ($C_L$), though other parameters may be voltage, temperature, or (semiconductor) technology-specific parameters.

Figure 2:
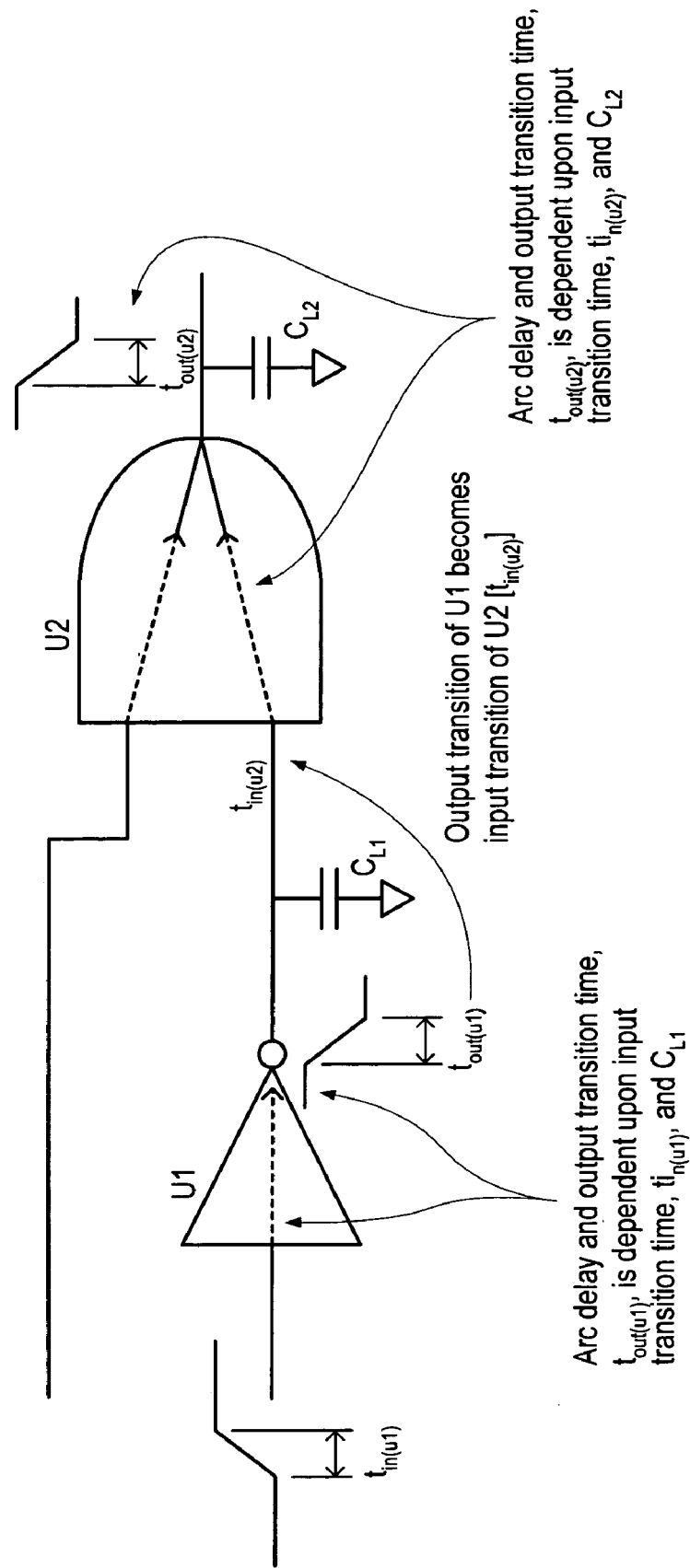
FIG. 2 illustrates an example of delay and transition time dependencies.

FIG. 2 illustrates an example of delay and transition time dependencies. The input transition time is merely the time that it takes for the input signal to change from its logic-low voltage to its logic-high voltage. In a simple STA, the load capacitance is known ahead of time, but the input transition time is not known until the output transition time of the previous stage is known.

Therefore, once $t_{in}$ to an arc is known, then the arc's delay is computed as a function of $t_{in}$ and $C_L$. The arc evaluation would also produce the output transition time, which would be used as the input transition time of the next stage.

So far, the description has considered one type of timing arc—the arcs that represent the delay within a device such as a gate, flip-flop, or higher-level design block. Such devices are interconnected by conductive material (usually a metal). Today, these interconnections (merely referred to as interconnect), can comprise a substantial, even major, portion of the overall delay for any given path of a circuit.

As such, this delay is also modeled and may be represented by a net timing arc where net refers to the collective interconnect between an output point and any number of subsequent input points. Because these types of arcs are fundamentally the same as any other arc discussed, their description appears in later parts of this document. Note that, the net arcs, though present, are not explicitly shown in the illustrations.

Figure 3:
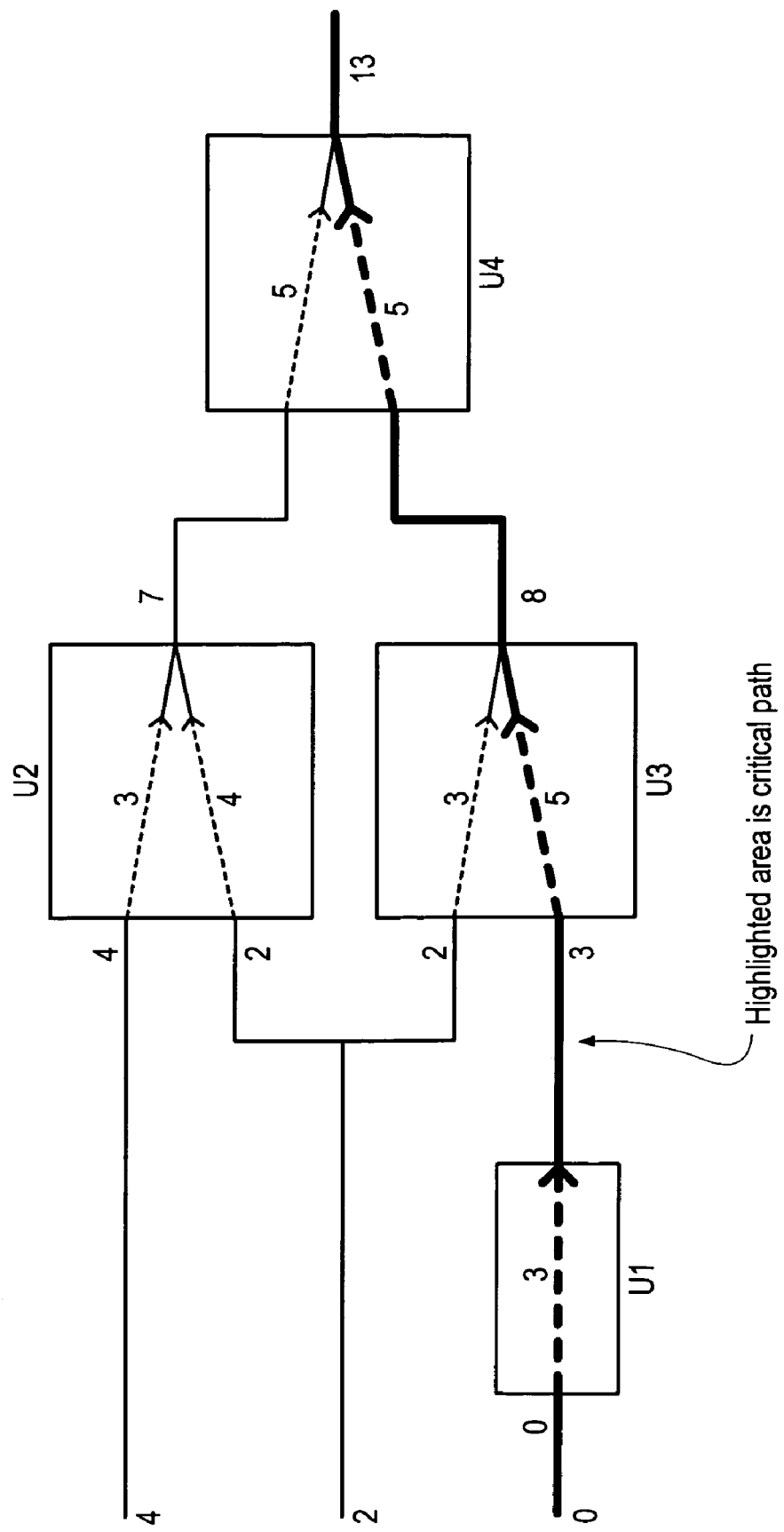
FIG. 3 depicts a relatively simple circuit used to illustrate the overall nature of STA.

FIG. 3 shows a relatively simple circuit used to illustrate the overall nature of STA. For simplicity, all timing arcs are considered to have constant delays (annotated in the illustration) and do not consider the transition type (high-to-low or low-to-high). Furthermore, to convey that the STA does not necessarily know the function of any element, no functional information is conveyed via the schematic symbol. Only the arcs are shown. The starting values at the inputs are the initial arrival times for this circuit.

Note the highlighted path (including U1, U3, and U4) in FIG. 3. This is the critical path defined previously. The STA considers neither the function of the logic elements nor the source or exact timing of the signals. For instance, if U3 is an AND gate and its non-highlighted input were a logic zero, then no signal could propagate, thus making this an invalid critical path. The STA does not necessarily consider whether the sensitization of a path is possible. In fact, if the function of a block (or blocks) is not known, then the possible sensitizable paths cannot be automatically determined.

There have been many STAs created and produced over the life of the Electronic Design Automation (EDA) industry. Many of these were created to demonstrate new concepts and various methods of performing STA. Some of these were targeted at transistor-level circuits while others were targeted at the gate (cell) level. Most STAs being produced today are targeted at the gate level, and it is this type of STA on which this discussion focuses.

Figure 4:
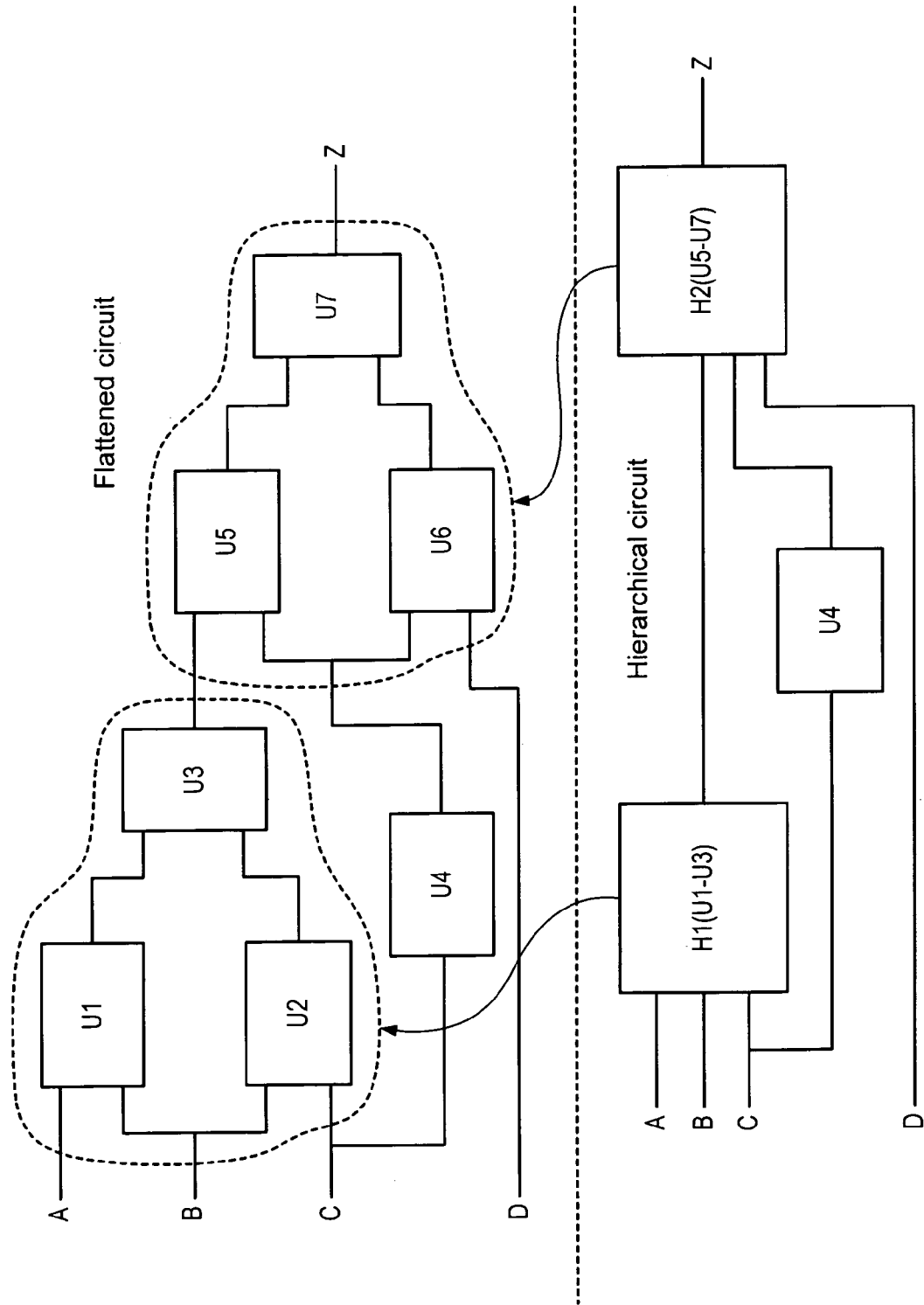
FIG. 4 shows an example of a flattened circuit versus a hierarchical circuit.

Traditionally, STAs process a circuit in a "flat" manner, even if the circuit is specified as a collection of hierarchical units. FIG. 4 shows an example of a flattened circuit versus a hierarchical circuit. The two circuits in FIG. 4 are identical, but one is illustrated in a flat manner while the other in a hierarchical manner.

If a hierarchical circuit is encountered, the traditional STA will flatten it to obtain a circuit that it can work with. Previously, this flattening process and the general discounting of hierarchy were acceptable, because circuits were relatively small. Flat circuits could easily fit into the storage of conventional computers and processed in a reasonable time. However, the complexity of circuit representations has increased at a rapid rate and at a rate faster than the storage capacity and processing power of today's computer systems.

Moreover, sub-circuits are being independently packaged into self-contained units and introduced into new designs in a hierarchical manner. In some cases, the content of these units is hidden from the users, so the STA cannot incorporate the unit's contents into a flattened representation.

Performing static timing analysis of a flattened logic circuit is conceptually simple. The first step in performing the STA is to construct a timing graph of the circuit. To illustrate how a graph is derived from a circuit, FIG. 5 shows the circuit schematic of FIG. 3, with net designators added.

Figure 5:
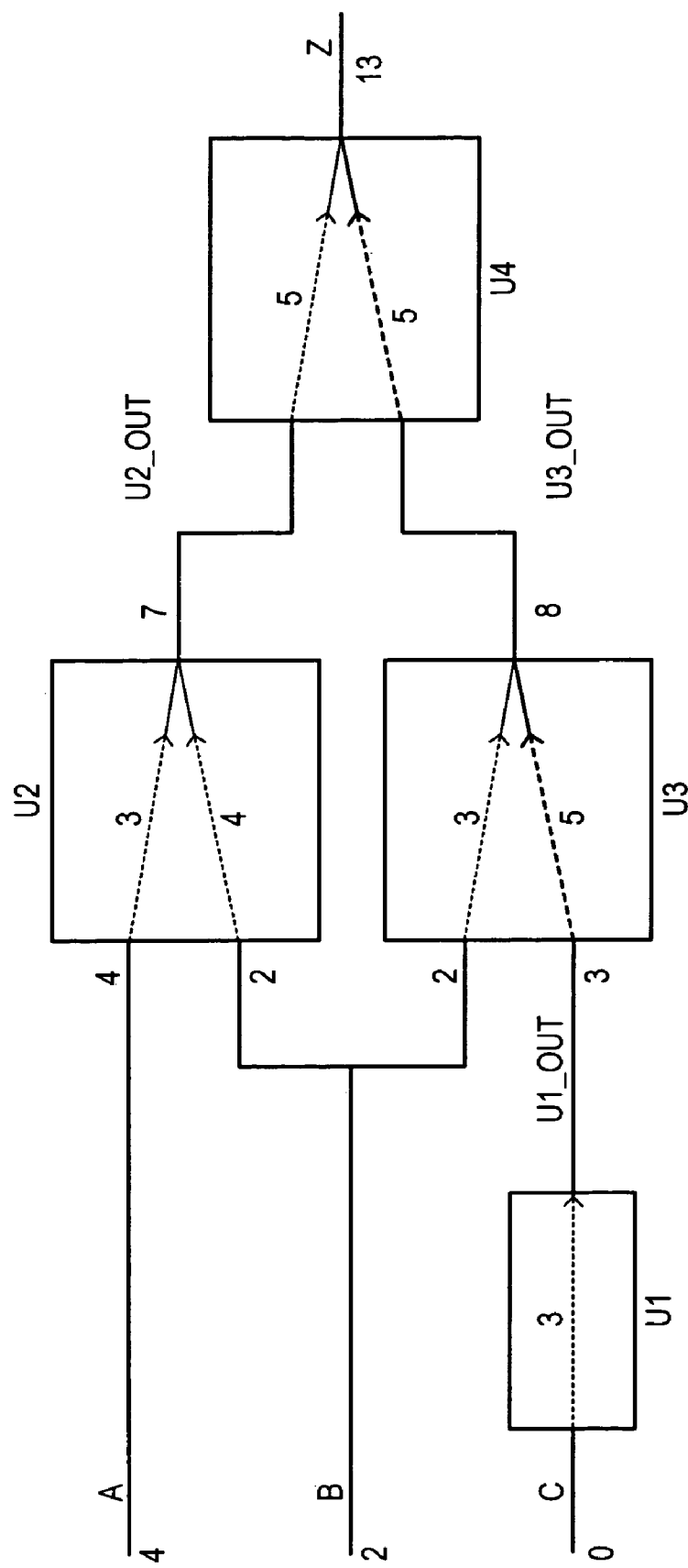
FIG. 5 illustrates the circuit schematic of FIG. 3, with net designators added.
Figure 6:
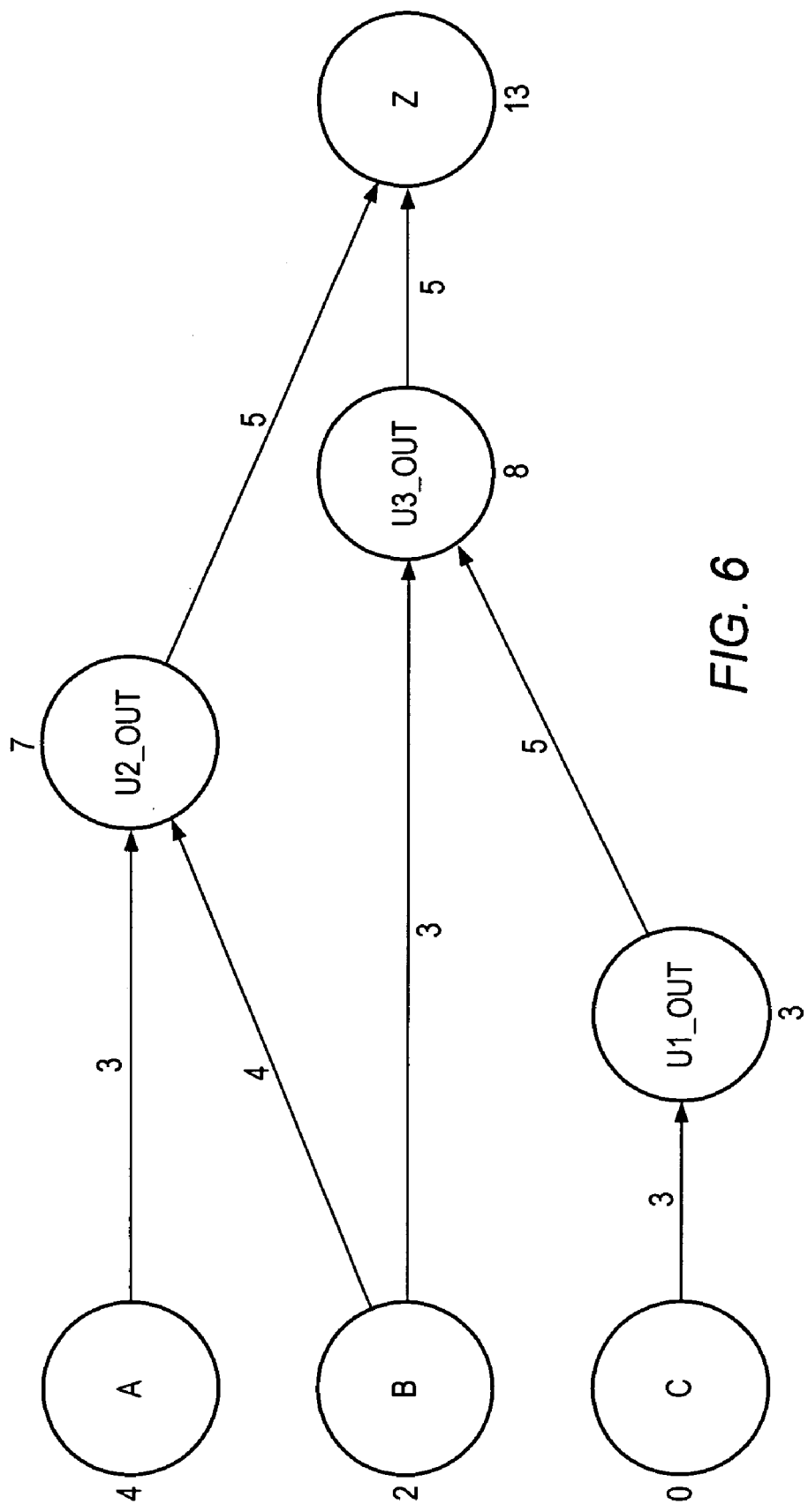
FIG. 6 depicts the timing graph of the circuit in FIG. 5.

FIG. 6 illustrates the timing graph of the circuit in FIG. 5. A graph is a collection of vertices and edges where each vertex represents a net and each edge represents a timing arc between two net vertices. Each edge is assigned a numerical value that results when the arc is evaluated. The net designators are shown within each vertex. The values adjacent to each vertex are the arrival times while the values adjacent to each edge are the arc delays. For a traditional STA, each net contains values for the transition time (discussed earlier), the capacitive load, and the arrival time.

Once the graph shown is constructed, then it is a relatively easy procedure to traverse it (starting from the inputs) to calculate the delay of each arc, the transition time of each net, and the resulting arrival times of each net. This is merely the process described above, repeated over many more levels of logic and many more logic elements.

Although this process is conceptually simple, there can be some pitfalls. First, the circuit shown here contains only a handful of elements, but a realistic circuit can contain millions of logic elements. Furthermore, most of the elements contain multiple arcs for any given input/output combination, thus complicating the construction and evaluation of the graph. Moreover, most circuits contain numerous synchronous elements such as flip-flops, multiple modes of timing and other tedious aspects of real circuit designs. This makes both the construction and evaluation of the graph more complex. It also demands significant storage for the graph and all the related information that normally accompanies a circuit.

The overhead associated with the storage of a circuit—connectivity information, descriptive information (used for human interface), storage of arcs, storage for results, and so on—adds up very quickly, resulting in potentially hundreds of bytes of storage per logic element. For a large circuit, this can amount to hundreds, even thousands of megabytes of main computer memory.

If STA were merely done one time or a few times during the course of a design project, the overhead of the process would be negligible and meaningless. However, the design of large integrated circuits (IC's) is performed by teams and often takes many months (sometimes more than a year) to complete. During the course of the design, STA may be run hundreds, even thousands of times. Moreover, due to the size and complexity of the circuits, it can take minutes to hours to do a single analysis. During the final phases of a design when the design is being "tuned" to improve its speed or fix timing problems, one designer may desire or need to run STA several times a day.

In the traditional STA, each analysis entails the repetition of the same tasks—reading the circuit description, flattening the circuit, building the graph, extracting the arc information, etc. Often many portions of the design have not changed. In this case, continually performing the same tasks over for each analysis cycle does not serve a useful purpose.

In compiled STA, stable blocks of logic are compiled into small and efficient components (a compiled module) that look like a normal logic element (albeit with more inputs and outputs). The compilation performs many of the same tasks as described in the traditional STA, except the timing graph is not evaluated to produce timing results.

Instead, the graph is traversed to generate sequences of arcs that, when evaluated in sequence, produce the same result as if the STA had traversed the original graph. All extraneous information is discarded after the generation of the sequences is complete, since the information need not be used by the STA in future analyses. Items thrown away include the graph, the names of elements, names of nets, names of pins, and storage for the circuit elements and associated connectivity. This results in a huge savings in storage.

Moreover, because all of the overhead processing has been performed, the execution speed of future STA on the compiled logic is significantly increased. Indirect, but significant, increases in speed also result from more efficient use of memory.

Using a compiled STA module is conceptually relatively simple. The STA compiler generates the timing sequences in a manner that is compatible with the timing arcs of current logic blocks, thus making the compiled module indistinguishable from a normal element. The STA, however, should be able to load a timing model for each design element (and associated timing arcs) in a manner that allows the arcs to be represented as both executable code and data. This means that proprietary STAs that use a closed, proprietary timing model may not be able to use compiled STA modules.

Assuming the host STA can employ timing models represented as code and data, then the difference between the arc of a primitive element (like an inverter) and that of a compiled unit is the internal complexity of evaluating the arc, which is invisible to the STA.

The time during the design process at which a "stable" module is compiled is both application-dependent and dependent upon the computing and EDA tool environment of the user. The degree of module stability also has the same dependencies. As such, it may be possible to transiently and automatically compile and cache modules after they have reached some degree of stability. This compiled version of a module would be used in place of the uncompiled version until a change was made to it.

The ability to automatically compile and cache timing modules using the CSTA method may be important in achieving overall desired efficiency within a design team, but this issue is largely dependent on the capabilities of the timing application(s) and the host environment.

To date, there are no true hierarchical STAs. Some appear to be hierarchical, but the hierarchical nature is merely an illusion presented to the user. Internally, the design is still flattened. After analysis, the results are "rolled" back up to the hierarchical level. This approach is fine if the flattened design will fit into computer memory and if the design elements of the hierarchical units are visible to the STA. Moreover, the hierarchical units should be presented to the STA either in standardized format (which means anyone can interpret the design) or in a proprietary format of the STA. This precludes the use of blocks that intentionally hide their internal design elements, either for security reasons or to present a more simplistic view to the user.

Figure 7:
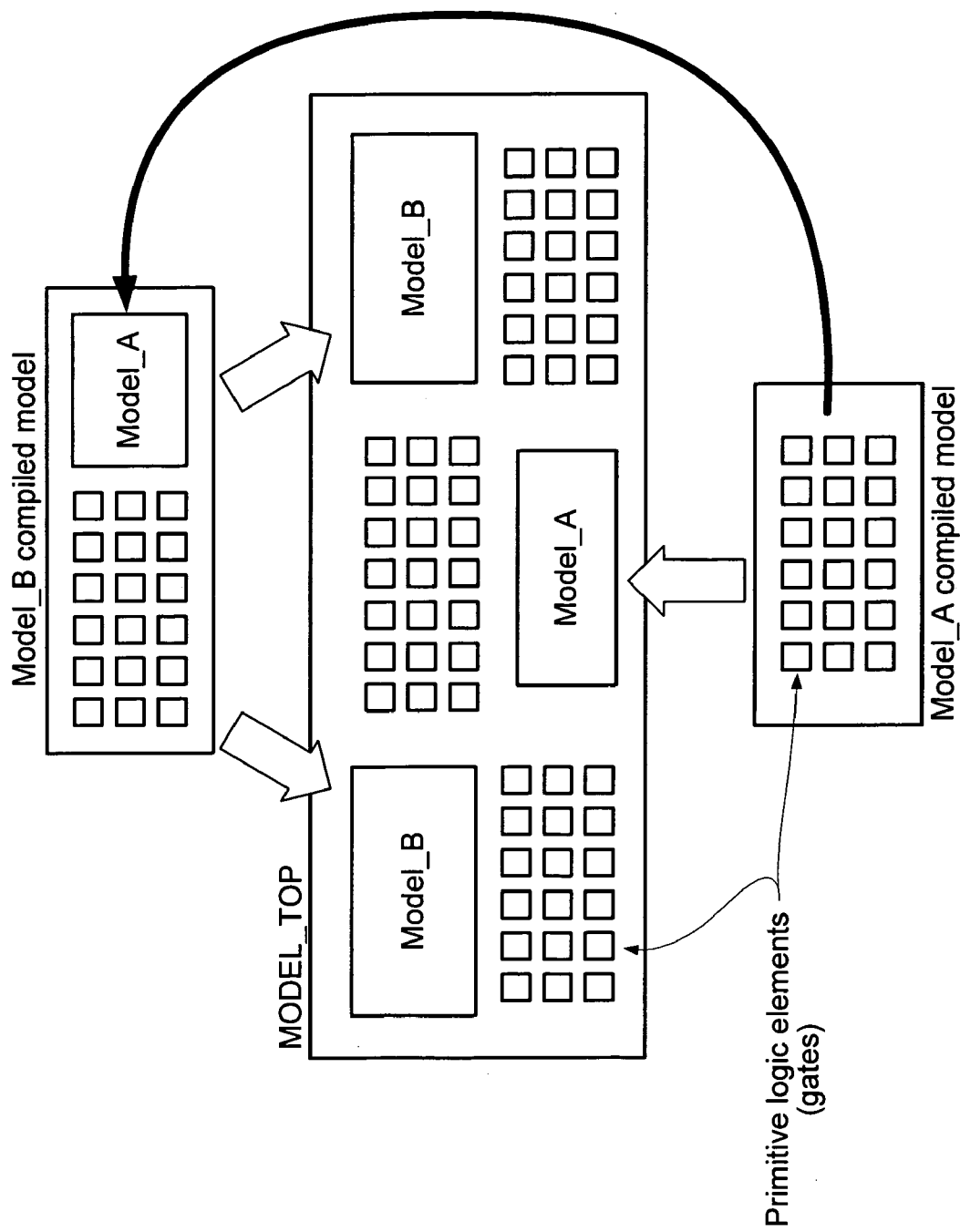
FIG. 7 shows an exemplary embodiment of the use of hierarchy.

CSTA modules lend themselves to use of hierarchy. Recall that a CSTA module is indistinguishable from any other logic element. As such, one CSTA module may be instantiated within another CSTA module. Hierarchical instantiation may be repeated to any number of levels. FIG. 7 illustrates an exemplary embodiment of the use of hierarchy.

The illustration shows a high level compiled model (Model_TOP) that may be used in any design or another module. It is composed of a number of primitive (non-hierarchical) elements and three instances of compiled modules. Two of the compiled modules are separate instances of the same model (Model_B). Model_B consists of a number of primitive elements and an instance of the compiled model Model_A. Note that Model_A is also used in Model_TOP which means there is one explicit use of Model_A in Model_TOP and two implicit uses of it (within each instance of Model_B).

Model_TOP contains three levels of hierarchy (one at the Model_Top level, one at Model_B, and one at Model_A). Model_Top could have been organized as a single level if Model_A and Model_B were flattened.

The basic premise in Compiled Static Timing Analysis is to perform as much preprocessing as possible so that sequential arc evaluations are used to evaluate a given arc of the compiled module. The preprocessing of stable design units is preferable, since the cost of this processing can be amortized over future analyses that include the given unit.

To avoid confusion, the elemental arc of a gate are simply referred to as arc while an arc of a compiled module will be referred to as a super-arc. It is the evaluation of super-arcs that ultimately determines the speed of the compiled module. Two things determine this speed: the time that it takes to evaluate each elemental arc, and the associated overhead for processing the entire sequence of elemental arcs.

The compilation and creation of super-arcs is the responsibility of the STA module compiler while the evaluation of the super-arcs is the responsibility of the sequence evaluator. Before looking at the compiler, let's consider the sequence evaluator since the characteristics of the sequence evaluator determine those of the compiler.

There are many ways to design a sequence evaluator. All are based on the desire to evaluate arc sequences in the least amount of time. In theory, one may let the target computer processor sequence the arcs directly. As described below, although this is a good theoretical approach, it may not be good in practice due to the practical constraints of computer resources.

The sequence evaluator described here is a path (point-to-point) evaluator. Other types of evaluators that will be mentioned later are the transition-specific path evaluator and cone evaluator. During this discussion, the term sequence evaluator (or just evaluator) refers to the path evaluator.

In the description presented, path evaluator refers to a type of evaluator that evaluates a sequence of arcs from one input point to a given dependent output point; transition-specific path evaluator is same as the path evaluator, except it considers super-arcs with a specified type of input-transition type and output-transition type; host model constitutes the compiled model for which a sequence is being evaluated; host application refers to the program that uses or executes the host model; input parameter constitutes generally a numeric value used by the sequencer to perform the evaluation; and transition type is the relative signal transition of an input or output point (the transitions LH (low-to-high) and HL (high-to-low) are considered here).

Besides speed, the goal of the evaluator is to accept one or more input parameters from the host model and using the parameters, produce one or more numeric results that are the same (or more accurate than) the same results that would be produced by the host application in evaluating the sequence in a flattened manner. By its very nature, a sequence evaluator is relatively simple (otherwise efficiency is sacrificed).

Figure 8:
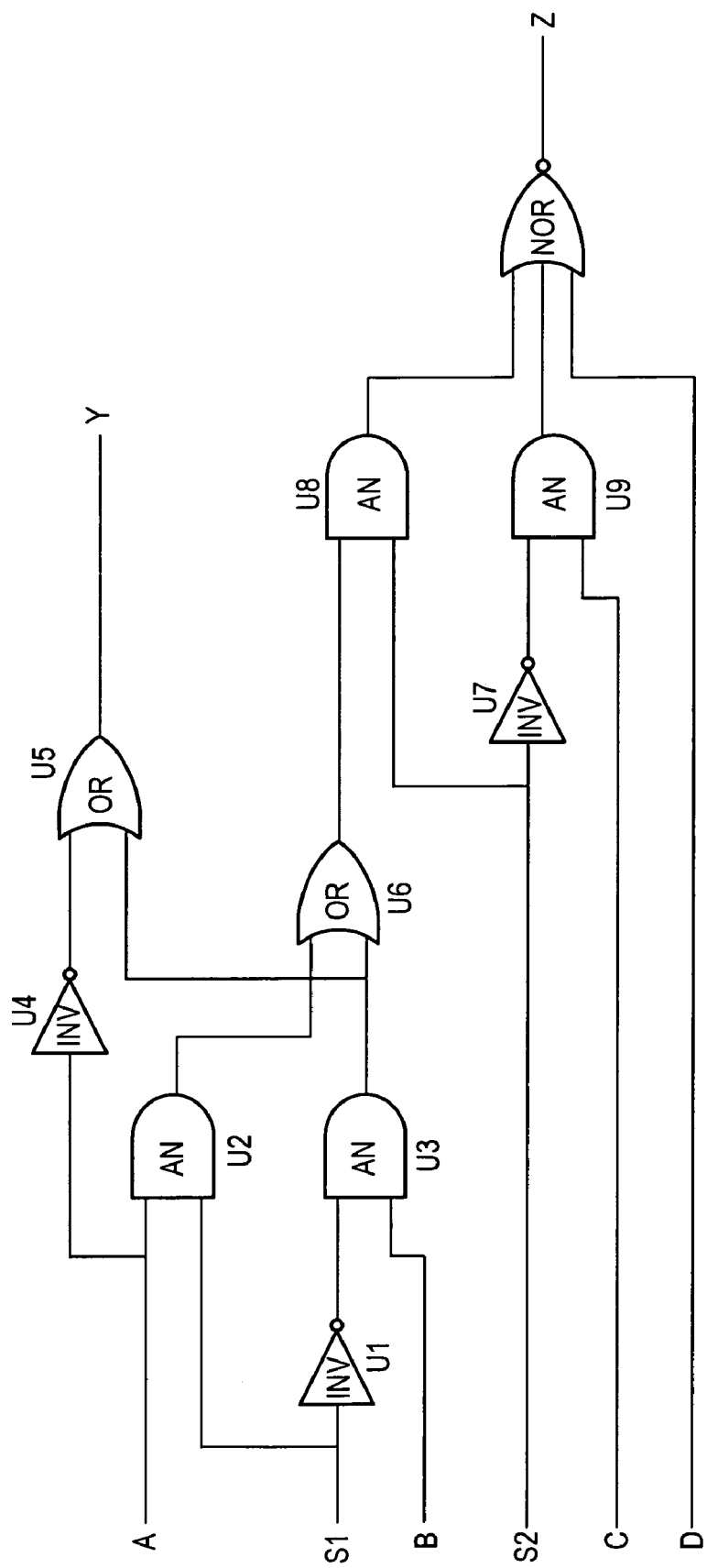
FIG. 8 illustrates a logic circuit consisting of simple logic gates, used to illustrate circuit analysis concepts.
Figure 9:
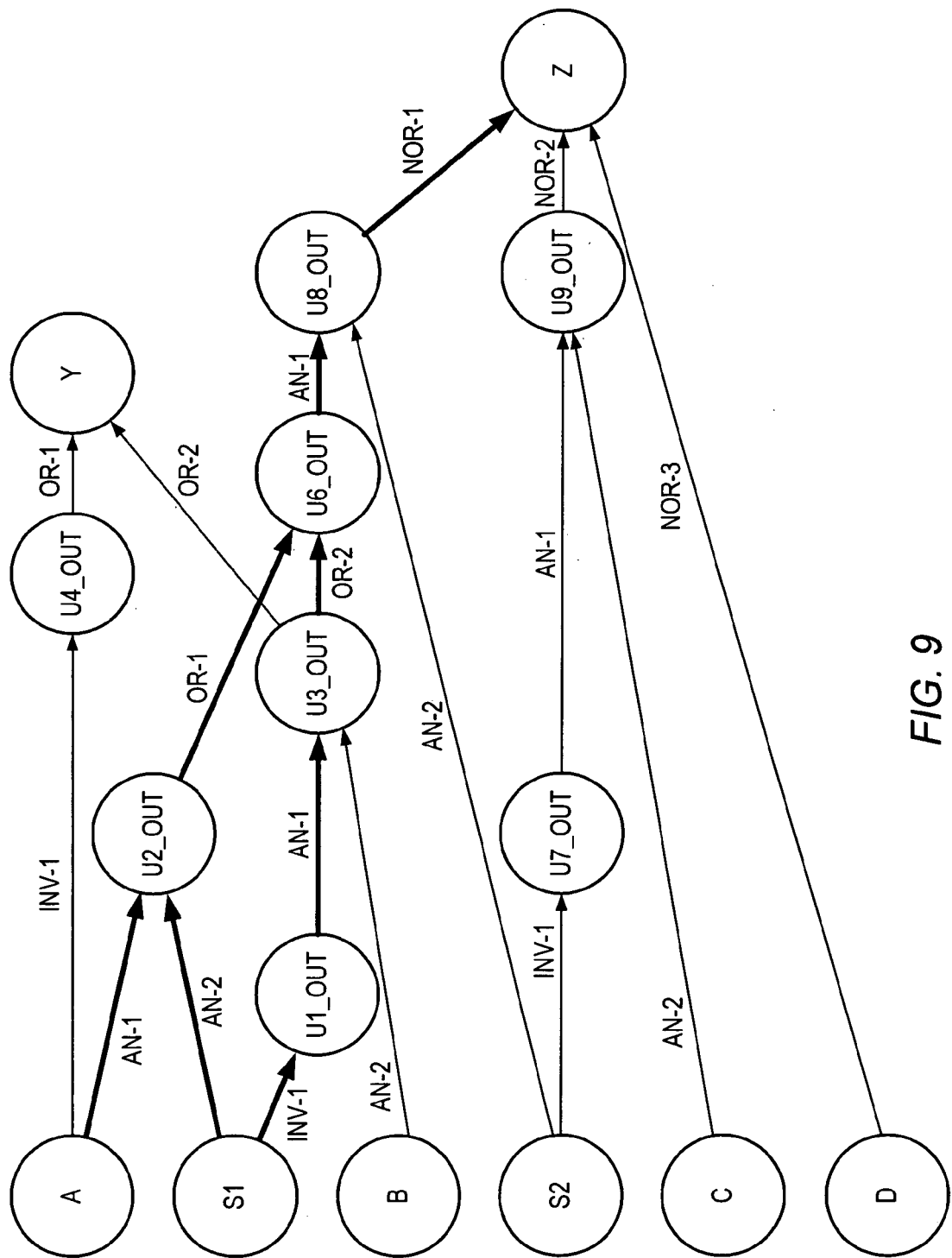
FIG. 9 depicts a graph corresponding to the circuit of FIG. 8 (paths from S1 to Z and from A to Z).

FIG. 8 shows a logic circuit consisting of simple logic gates, used to illustrate circuit analysis concepts. FIG. 9 shows a graph corresponding to the circuit of FIG. 8 (paths from S1 to Z and from A to Z).

Note that each arc is labeled with an arc identifier. Each identifier consists of the component type (AN, OR, INV, etc.) followed by the arc number within the gate. The AN-2 arc of the AND gate is presumed to be the same for all AND gates of this circuit. The same is true for like-numbered arcs of other gates.

Assume that for simplicity, that each arc has the delay shown in the following table:

| Arc ID | Delay (units of time) |
|---|---|
| INV-1 | 1.0 |
| AN-1 | 3.0 |
| AN-2 | 4.0 |
| OR-1 | 2.5 |
| OR-2 | 3.5 |
| NOR-1 | 5 |
| NOR-2 | 5 |
| NOR-3 | 5 |

Although arcs are identified by these convenient identifiers, they are, in general, actually computer addresses that point to the evaluation functions for each arc. The nature of arc identifiers, however, is not important for this discussion.

The circuit has several paths from the various inputs to the two outputs. Consider the path from input A to output Z, designated by:

A[AN-1]→U2_OUT[OR-1]→U6_OUT[AN-1]
→U8_OUT[NOR-1]→Z

This simple path can be identified merely by its series of arcs:

AN-1, OR-1, AN-1, NOR-1

Evaluating these arcs in order, and adding the result of each evaluation, produces the sum of the arc delays (3.0+2.5+3.0+5=13.5). This is an example of how the sequence would be represented for the evaluator—merely a simple sequence of arcs, conveying no direct information about the internal structure of the circuit. In real cases, input parameters such as the load capacitance and input transition time are used for each arc. This merely adds a parallel vector of parameters to the sequence. These may or may not be known ahead of time, depending upon the complexity of the arcs. For example, the parasitic information for a stable module may already be known and may be fixed. In this case, it is possible for the compiler to characterize the entire logic stage (device input to next device input), thereby combining two arc evaluations (device arc followed by net arc) into one. This is illustrated in detail below in the description of the module compiler.

Now consider the path from input S1 to output Z. Note that there are actually two separate paths between the two points, with the re-convergence of the path near the middle (at U6_OUT). This composite path is evaluated as a single entity, though the evaluation is somewhat more complex. At the juncture where the two paths merge, there will be two distinct accumulated delays. One of these can be propagated. For worst-case analysis, the larger of the two is propagated (along with its corresponding transition time). Furthermore, ignore signals from other input(s), as they are not part of this path.

Since the sequencer has no knowledge or access to the circuit's internal structure, it should be supplied with additional information that describes how to sum the delays and how to decide which result to propagate. To accomplish this, simple directives are supplied to the evaluator in parallel with the arc identifiers.

To control the path sequence evaluator, a series of simple directives is supplied in parallel with the arc identifiers (and other parametric information). Each directive is identified with a simple mnemonic. Directives and corresponding mnemonics and descriptions are listed in the table below:

| Directive Mnemonic | Parameters | Description |
|---|---|---|
| PEEK | n/a | Loads the accumulator with the result on the top of the stack |
| POP | n/a | Pops and discards the value at the top of the result stack |
| LOAD | update index | Loads the accumulator from the location specified by the update index |
| STORE | update index | Stores the current accumulator to the location specified by the update index |
| UPDATE | update index | Conditionally updates value at the location specified by the update index |
| PUSH | n/a | Pushes the current accumulator onto the result stack |
| REPEAT | count | Determines # of consecutive arc evaluations |

The purpose of these directives is to facilitate the propagation of a single (composite) result (the accumulator) to a conclusion (the end of the path). In between, a stack is used to save the accumulator at divergent nets while designated memory locations are used to store and update convergent nets.

The first three directives (PEEK, POP, LOAD) are called the preoperative directives while the next three (STORE, UPDATE, PUSH) are called the postoperative directives. Note that collectively, three directives operate upon designated memory locations while the other three operate upon a stack. The last directive (REPEAT) is actually an implied directive (illustrated below). It is the operative that determines the number of arcs that should be evaluated from the current sequencer state.

Each mnemonic is represented as an 8-bit value (or other values with fewer or more bits, as desired), and stored sequentially in a vector. This vector parallels the sequence of arc identifiers and associated parameters. FIG. 10 depicts an example of directive mapping. More specifically, the Figure shows directive mapping to the 8-bit field is shown below (bit 7 is the most significant bit).

The Pre Op field designates an operation that is performed prior to the next arc evaluation(s). If none is specified, then it assumed that the current accumulator result is being used. Note that the repeat operation is implied by a non-zero REPEAT count.

The composition of the accumulator is dependent upon the model parameters and results used and produced, respectively. The load or peek operations are used to load the accumulator with an existing result. The load operation overwrites the accumulator with the value at a specified update index. The index is specified immediately after the current directive. The peek operation overwrites the accu mulator with the value at the top of the stack. The pop operation performs the same function as peek, but also removes (pops) the value from the stack.

After the pre-op is performed, if any, then up to 15 arcs may be evaluated. The number evaluated is determined by the REPEAT count. The result of each evaluation is added to the accumulator. Zero is a valid repeat count. If more than 15 arcs are to be evaluated, then additional directives (with no pre op) may be specified as needed.

After arc evaluation (if any), then the post op (if any) is executed. The first time a convergent node is encountered, the store directive is issued to store the result at the node's corresponding update index (indices are determined at compilation). Subsequent visits to this node cause an update directive to be generated. If a node branches (diverges), then the current accumulator is pushed onto the stack with the push operation.

The store, load, and update directives use an update index, which is stored as a relative index just following the opcode byte. Each convergent node is assigned a unique update index that is used to store its current composite result. There is no index for non-convergent nodes. The first time a convergent node is visited the store post-op is used to store the current accumulator to the node's assigned update location. At subsequent visits, the update directive will cause the current accumulator to be stored if the delay is greater than that already stored for the node. At some point, the load pre-op is issued on the node to continue accumulation, after all updates to the net have been completed.

At the beginning of sequence execution, two pointers are set: one points to the start of the sequence directives and the other to the arc sequence. As the sequence evaluator executes each directive, the arc pointer is incremented automatically to coincide with the next directive. The path result is complete once all directives have been executed.

The sequencing of a path may be described by its mnemonics. A full mnemonic is specified as follows: [pre-op] [REP n] [post-op]. Any or all of the fields may be null (equal to zero). If all are null then this is designated as a NOP (no operation). The full mnemonic may be followed by an update index, if applicable. The following expression provides an example of a complete mnemonic: PEEK-REP 3-UPDATE (7).

The example specifies that the accumulator be loaded with the value at the top of the stack (the stack is not popped). Next, the composite accumulator (along with possible parameters obtained from parallel vector) is used to perform three sequential arc evaluations, using the next three arcs in the arc sequence vector. The result of each arc evaluation is numerically added to the current accumulator. The arc-sequence vector pointer is advanced to the next arc after each evaluation. Next, the value at update index 7 (relative to a base location) is updated with the new accumulator, if the new value in the accumulator is greater than the current value at storage location 7.

Below is an example of the mnemonics and arc sequence vector for the composite path, previously described. The hexadecimal value preceding each mnemonic represents its corresponding binary encoding (see FIG. 10). The four-digit values include an 8-bit storage location index. Keep in mind the accumulator is always cleared at the start of a sequence:

Mnemonics:

| | | |
|---|---|---|
| 0C: | PUSH | //push zero (accumulator) for S1 |
| 3401: | REP 3-STORE (1) | //S1 → U1_OUT → U3_OUT → U6_OUT |
| | | //evaluate arcs INV-1, AN-1, OR-2 |
| 2B01: | POP-REP 2-UPDATE (1) | //S1 → U2_OUT → U6_OUT |
| | | //(evaluate AN-2, OR-1) |
| 20: | REP 2 | //result is in the accumulator |
| | | // (evaluate AN-2, NOR-1) |

Arc vector: INV-1, AN-1, OR-2, AN-2, OR-1, AN-2, NOR-1.

Sequence directives could be considered as the instructions of a machine that executes path sequences. In fact, these directives, along with the arcs could just as well have been generated directly into the native instruction set of the target computer system, as desired.

The pseudocode below illustrates one possible implementation of the sequence evaluator above:

```
initialize stack, S, to empty;
initialize arc id pointer, IDP;
A ← 0;                    //clear accumulator, A
for each encoded 8-bit directive, D, from directive vector {
    op ← preop(D);        //get directive preop code
    if (op equal to PEEK) {
        A ← TOP(S);       //load A with value at top of S
    }
    elseif (op equal to POP) {
        A ← TOP(S);       //load A with value at top of S
        POP(S);           //delete value at top of S
    }
    elseif (op equal to LOAD) {
        get update location, L, from directive vector;
        A ← (L);          //overwrite A with value at location L
    }
    numEval ← value of REPEAT field of D;
    for I = 1 to numEval {      //not executed if numEval is 0
        evaluate arc at IDP;
        A = A + (arc result);
        increment IDP;
    }
    op = postop(D);       //get directive postop code
    if (op equal to STORE) {
        get update location, L, from directive vector;
        (L) ← A;          //overwrite data at L with
accumulator value
    }
    elseif (op equal to UPDATE) {
        get update location, L, from directive vector;
        if ( (L) < A ) then {
            (L) ← A;      //overwrite value at (L)
        }
        else A ← (L);     //replace A with larger value
    }
    elseif (op equal to PUSH) {
        push A onto top of S;
    }
}
```

In essence, this is a form of a virtual machine. In other words, one could design a finite-state machine that executed an arbitrary sequence of the aforementioned directives.

Note that the outer for loop is repeated once for each directive. Thus, if the directive vector contains N directives, then the loop is repeated N times. Also note that in this example, the storage locations (used for the store, update, and load post-operations) are stored with the associated directive as the next 8 bits. In general, these indices may use fewer or more bits. There are different ways to handle this, and it falls within the knowledge and skill of a person of ordinary skill in the art who has the benefit of the description provided here.

Using this algorithm, the directives in the previous example would cause the following primitive operations to be executed (annotated for each directive):

```
Initialization (prior to executing any directives)
    setup stack S;
    clear the accumulator, A;
PUSH
    push A onto stack, S (A is zero at this point);
REP 3-STORE(1)
    evaluate arc INV-1 and add result to A;   //A is zero before this
    evaluate arc AN-1 and add result to A;
    evaluate arc OR-2 and add result to A;
    store A at storage index 1;
POP-REP 2-UPDATE(1)
    pop value from stack into A (value on stack is zero);
    evaluate arc AN-2 and add result to A;
    evaluate arc OR-2 and add result to A;
    if (A > value at index 1) then overwrite location with A;
    otherwise load A with value at index 1;
REP 2
    evaluate arc AN-2 and add result to A;
    evaluate arc NOR-1 and add result to A;
```

Done. Accumulator A now contains the result.

The above description of the evaluator interprets byte-wise mnemonics to perform the sequence evaluation. As such, there is overhead incurred in interpreting the mnemonics. This overhead incurred by the evaluator is considered relatively small and negligible in most implementations.

The implementations of the sequence interpreter will vary depending upon the representation chosen for the vector of directives, storage of memory indices, parameters used for each arc, and other factors, as persons of ordinary skill in the art who have the benefit of the description of the invention understand. In general, there are other possible implementations for the interpretive version, but all follow the same basic architecture.

Another way to implement the evaluator involves the generation of actual native machine code instead of the interpreter mnemonics. This bypasses the interpreter overhead by replacing each mnemonic with one or more machine-level instructions.

There are disadvantages of this approach that may negate the elimination of the direct overhead. First, the storage used by the machine instruction(s) that correspond to a given directive may exceed substantially the storage used by the interpreter equivalent. At best, each directive will use one word (generally 32 to 128 bits) of computer storage, while the equivalent interpreter directive uses 8 bits.

Because of this increased storage, the evaluator may actually execute slower due from memory page faults and cache misses since more memory is read. Furthermore, the resultant machine-coded sequences will use substantially more disk space to store, negating one of the important advantages of compiled modules. These larger modules will also take more time to load. Moreover, the evaluator and application have no direct control on when a sequence is loaded, how it is loaded, or how many are loaded. This may cause more memory to be used than that of the interpreter version.

STAs normally traverse a timing graph to compute delays, transition times, and arrival times. In doing so, the STA:
  selects the timing arc(s) to be evaluated, based on the transition-type
  sets up the parameters to be used in evaluating the arc, which may entail indirect access to memory to obtain the parameters
  evaluates the arc(s), possibly using indirect access to memory
  matches the resulting delay(s) to the proper arrival times
  adds the delays to the arrival times, often by indirect accesses to memory
  traverses the graph to the next evaluation node, often by pointer indirection The STA module compiler performs all the steps above, except for the arc evaluation and accumulation of results. It pre-locates all parameters, reduces the number of memory accesses used to propagate results, pre-selects arcs based on transition types, and arranges the arcs in the proper sequence for evaluation.

Each of these steps involves one or more decisions that are made in real-time by the traditional STA and are done for each repetition of the analysis. Any of these steps, considered alone, may not be considered significant. But when considered together, they can take, and often do take, more time than the evaluation of the arcs.

The steps above represent the minimum tasks that are performed. A typical STA often uses many more steps since it is flattened version of the model is maintained in the context of a much larger design. For example debugging information is generally maintained. This information is not needed for a compiled model, nor is other information such as the computation and storage of slack values internal to the model. The computation of slacks may be as expensive as computation of delays and arrival times, depending upon the method used.

A slack value indicates the difference between the arrival of a signal at a given target (a given net, device input, or device output) and the specified or required arrival time, in reference to the beginning of a new clock cycle. For example, if the signal is to arrive at the output in 1000 picoseconds, but arrives early at 900 picoseconds, then a slack of 100 picoseconds would be indicated. A positive value is desired. Negative values indicate that the composite delay of the path (to the target) is reduced (or the clock cycle time increased).

Regardless of any savings, the key point to remember is that the savings are compounded when the model is used repetitively. Single uses of the model may result in minor, if any, savings over a traditional STA. There are many sources of memory savings for compiled STA modules, which include:
  No need to save delay results of nodes within the module between successive path sequence evaluations
  No need to compute and save slack values
  No need to store an explicit graph for each path
  No need to store names of internal blocks, pins, or nets.

As a result, the relatively significant memory used by the compiled modules is the sequence information. In addition, due to the method in which the sequences are organized and accessed, they may be stored and accessed from disk storage in a sequential manner, resulting in a larger savings.

Initially, it may seem that this might compromise the speed. But that is not necessarily the case, since the data is accessed sequentially, rather than in a random fashion. Furthermore, the model can "anticipate" the order in which the application may access the sequences, allowing the model to load one set of sequences while the application is computing the results for one or more other sequences.

The result of the various memory reduction techniques can result in a 10-time to 100-time reduction in memory usage, depending upon the host STA and the various techniques employed.

Fundamentally, the purpose of the STA module compiler is to read a description of a logic circuit, along with the associated timing models of each element in the circuit, and then produce a series of "executable" sequences. Each sequence, when evaluated by the model's sequence evaluator, would predict the delay of a given pin-to-pin path with the same accuracy of the host STA (as if the circuit had been analyzed flat by the STA).

However, its responsibility does not end there. Each generated sequence is organized such that it may execute as fast as is possible under some given set of constraints. These constraints generally involve memory or disk storage use, ease-of-implementation, and sequence evaluator constraints.

The output sequences of the compiler are governed by the needs of the sequence evaluator. The sequence evaluator's role is to evaluate a super-arc in the fastest possible time. One way to do this is to eliminate all overhead operations. Some overhead operations are apparent, such as the access of data via indirection (pointer-following), calls to non-local subroutines, where a local one would suffice. Other implicit operations are not so apparent, such as cache misses and/or memory page faults, both of which are relatively expensive if the same pages are continually involved.

The former (cache misses) is relatively frequent for programs that are not organized in an optimum fashion. The later (page faults) is generally due to the need for more main computer memory than is available, which can often be alleviated by improving program organization. The later is often the most expensive of operations and may cause programs that normally execute in linear time to execute in non-linear time when frequent paging is occurring.

If properly organized, a program that executes in linear-time with sufficient storage will also execute in linear time if page faults occur a known constant number of times per page (generally one) and in a sequential fashion.

Figure 11:
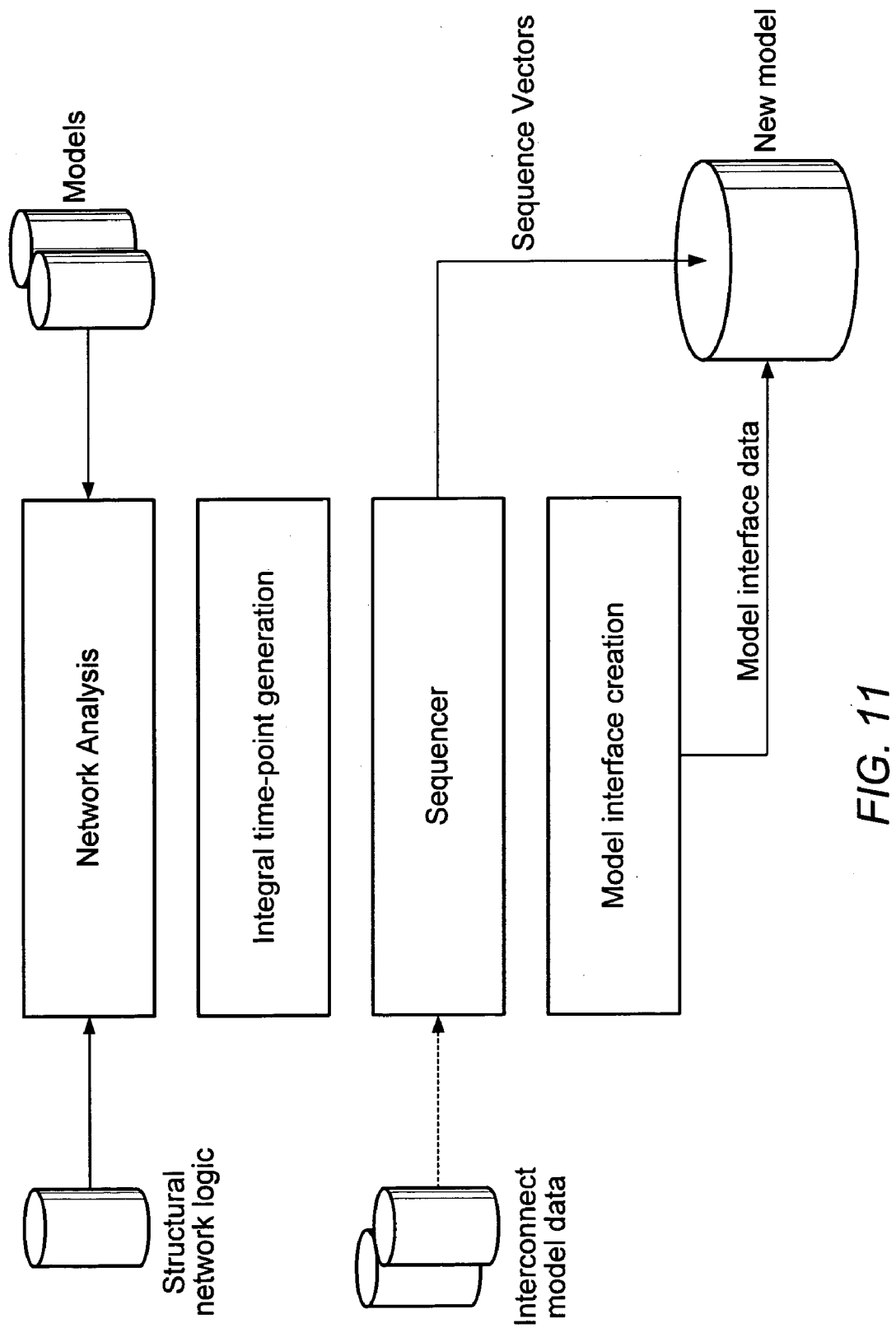
FIG. 11 illustrates a simplified version of the compiler's structure according to an exemplary embodiment of the invention.

FIG. 11 illustrates a simplified version of the compiler's structure according to an exemplary embodiment of the invention. Each of the phases is described below.

The network analysis phase is responsible for converting the structural logic along with composite timing models (denoted as models) into a timing graph. The timing models that are used here will be either elemental models or compiled models, neither of which is distinguishable from the other.

Figure 12:
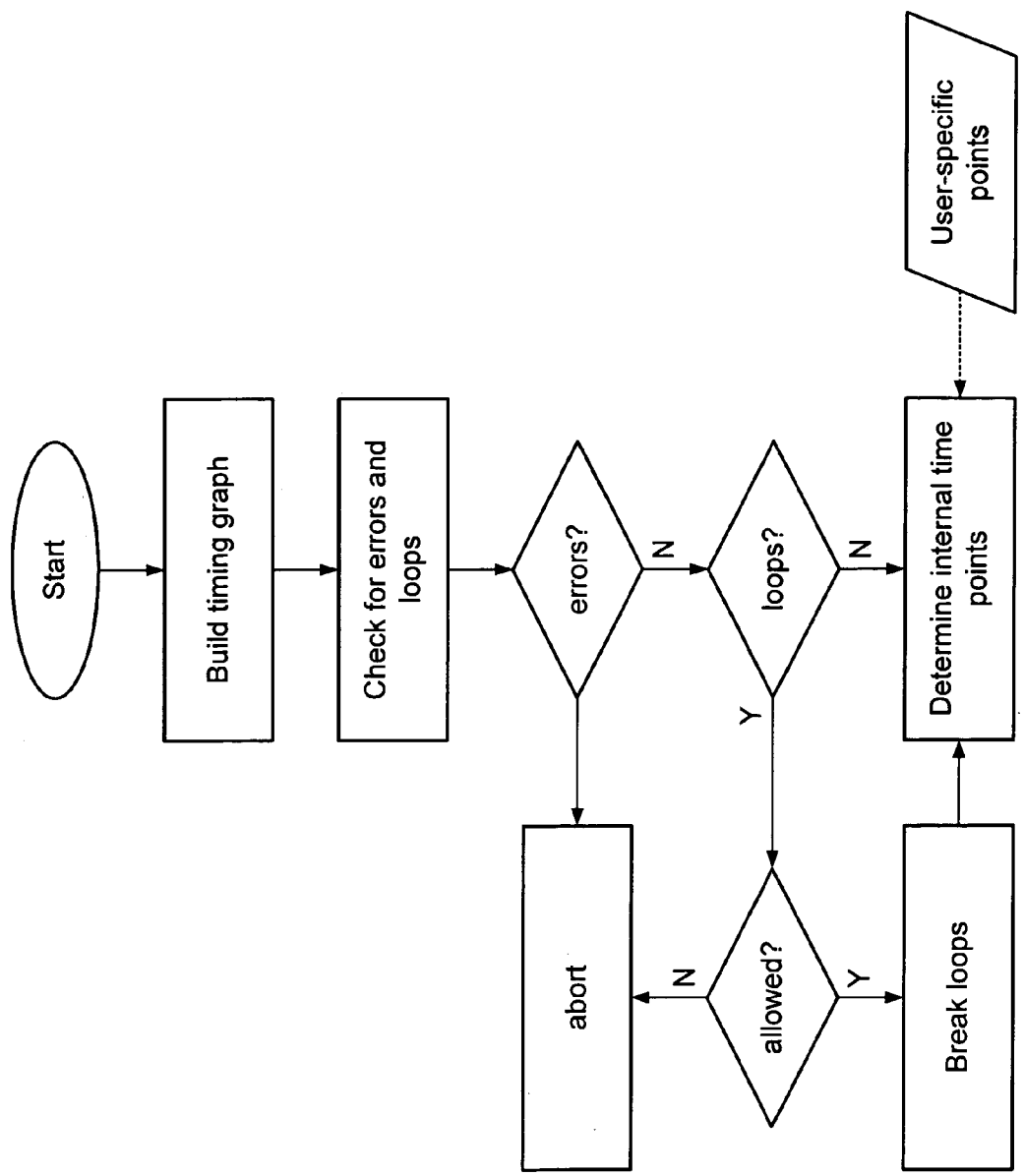
FIG. 12 depicts a flow diagram for the primary flow and tasks performed in network analysis.

The first step in network analysis is to parse the structural network to create the network timing-graph. This graph will be similar to that discussed previously (see FIGS. 8 and 9). Once this graph is constructed, then analysis is much the same as the timing analysis performed by a typical STA, except no arcs are evaluated and no numerical results are produced. FIG. 12 illustrates a flow diagram for the primary flow and tasks performed in network analysis.

The timing graph represents that of the entire network, in contrast to building a graph for each path, which is done later. Note that even though a graph similar to that in a typical STA is built, it consume less memory, since the names of elements, pins, or nets, are not stored, as this information is not needed for compilation. Moreover, CSTA is less concerned with memory and runtime during compilation, since it is a one-time chore. Some other chores during network analysis include checking for loops in the graph, checking for invalid networks, and determining internal timing points.

The following describes the various parts of the flow diagram in FIG. 12. Loops in the graph represent feedback within the network, which is not synchronized by a clock signal. This can occur due to feedback within a chain of combinational elements and/or transparent latches. Neither of these can be handled in a deterministic way by the model and may entail human intervention during model compilation and/or during use of the model.

Network errors include elements that are unreachable (floating) from any input point, illegal network connections, and other conditions that might preclude proper circuit operation. Internal time points are those points within the circuit that do not start or terminate at a primary input or output, respectively. For instance, the input of a flip-flop (FF) or latch will appear as a path endpoint, while a FF output will appear as a path starting point.

This is due to the fact that static timing analysis is performed within a single clock cycle. As such, one of the goals of the STA is to predict the signal propagation time from some starting point to the input of a FF. This prediction allows the STA to check to see if the setup time of the FF is met (i.e., signal at FF's data input does not arrive too late, relative to clock input). Therefore, it is natural that the FF's input be considered the terminating point of the path (the output).

Signals at the output of a FF are first considered valid at the start of a clock-cycle; therefore it's natural to treat them as the beginning (input) of a path. Even if the STA determines that the FF's data setup time was violated, it will consider the path from the FF's output to be valid since it is the beginning of a new path.

Various constraints, such as the notion that the data input of a FF should stabilize some amount of time before the end of the clock cycle (beginning of next cycle), are supplied to the STA as a series of one or more check rules. A check rule is similar to an arc, except the result of evaluating a check rule is a value used in checking a signal constraint, generally in relation to one or more other signals.

Figure 13:
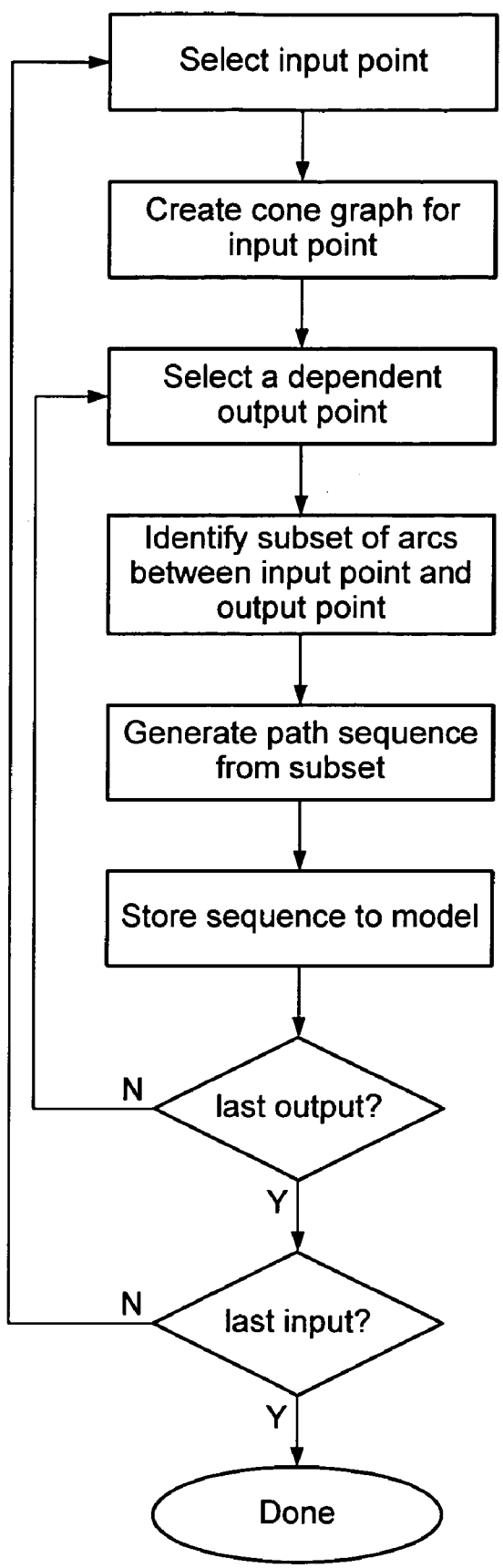
FIG. 13 shows the sequence generation process.

After network analysis and internal time point generation, the compiler then proceeds to the generation of the sequences. FIG. 13 shows the sequence generation process. This process begins by selecting an input point. An input point may be a primary input to the model or an internal point.

Next, a cone graph relative to the selected input point is extracted from the main timing graph. A cone graph is merely a sub-graph that is extracted from the main graph by tracing all paths from the input point to all reachable output points. These output points are referred to as the dependent output points (dependent upon the starting input point). The designation "cone graph" was selected due to its relative shape (a single input fanning out to one or more outputs).

Figure 14:
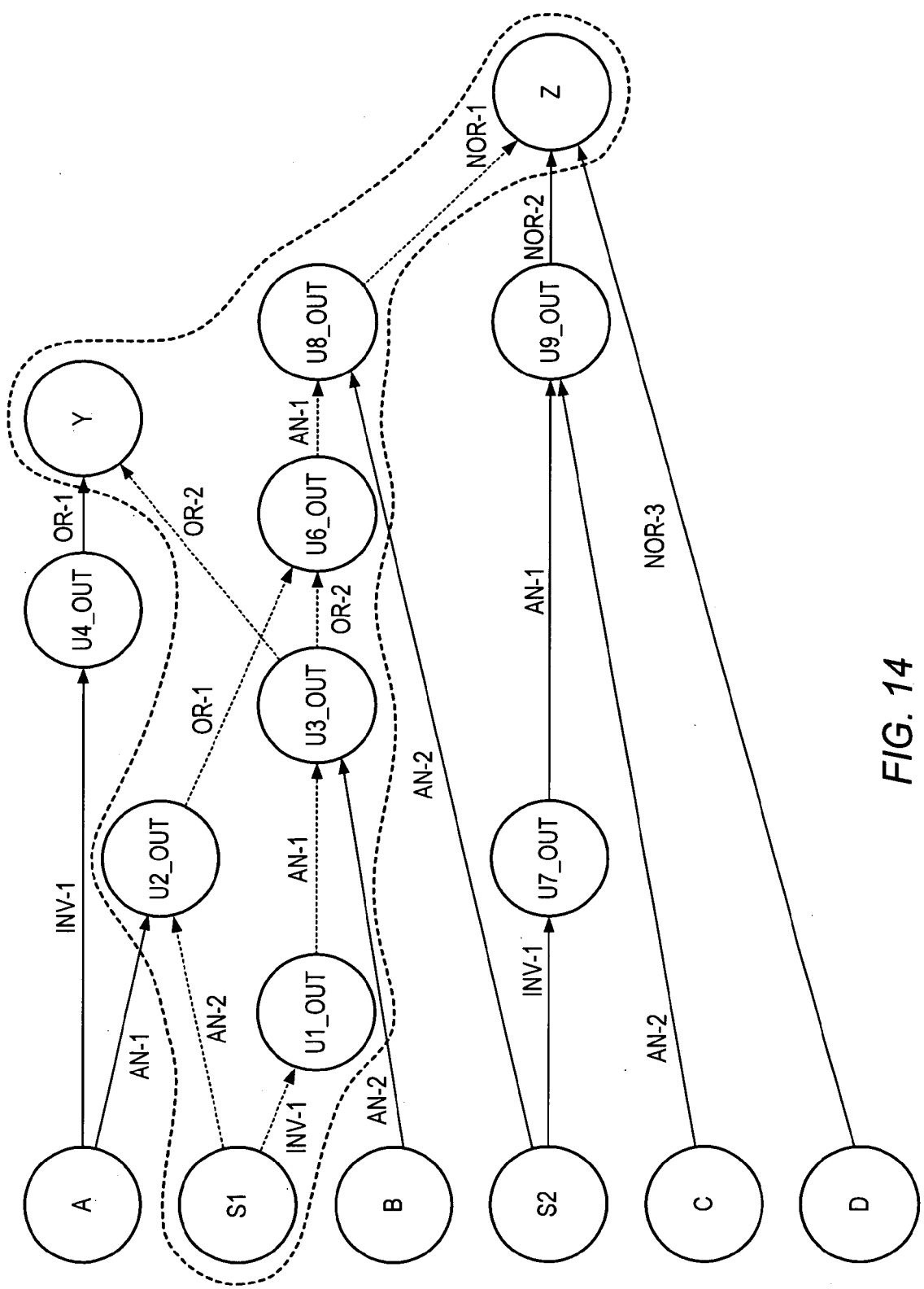
FIG. 14 illustrates the graph of FIG. 8, adding a cone graph.

FIG. 14 illustrates the graph of FIG. 8, adding a cone graph. The nodes enclosed by the dotted line comprise the cone graph for input S1. This cone graph has two outputs (Y and Z), which are considered to be the dependent output points of input S1.

The process loops through all dependent output points for each cone graph. For each dependent point, it identifies the subset of arcs between the input point and dependent output.

This set of arcs comprises the composite path between the input and dependent output. This subset is identified from tracing backwards from the output point to the input point.

Next, the subset of arcs is sequenced along with the generation of the corresponding sequence-evaluator directives, discussed above. The rules for sequence generation are relatively simple, but there are two primary methods of sequence generation, which are distinguished by the use of memory during sequence evaluation. These methods are discussed below.

Each path sequence is stored to the target model as completed. The process of sequence generation is continued for each dependent output point across all input points, resulting in a path sequence for all input to output points of the model's underlying logic circuit.

Figure 15:
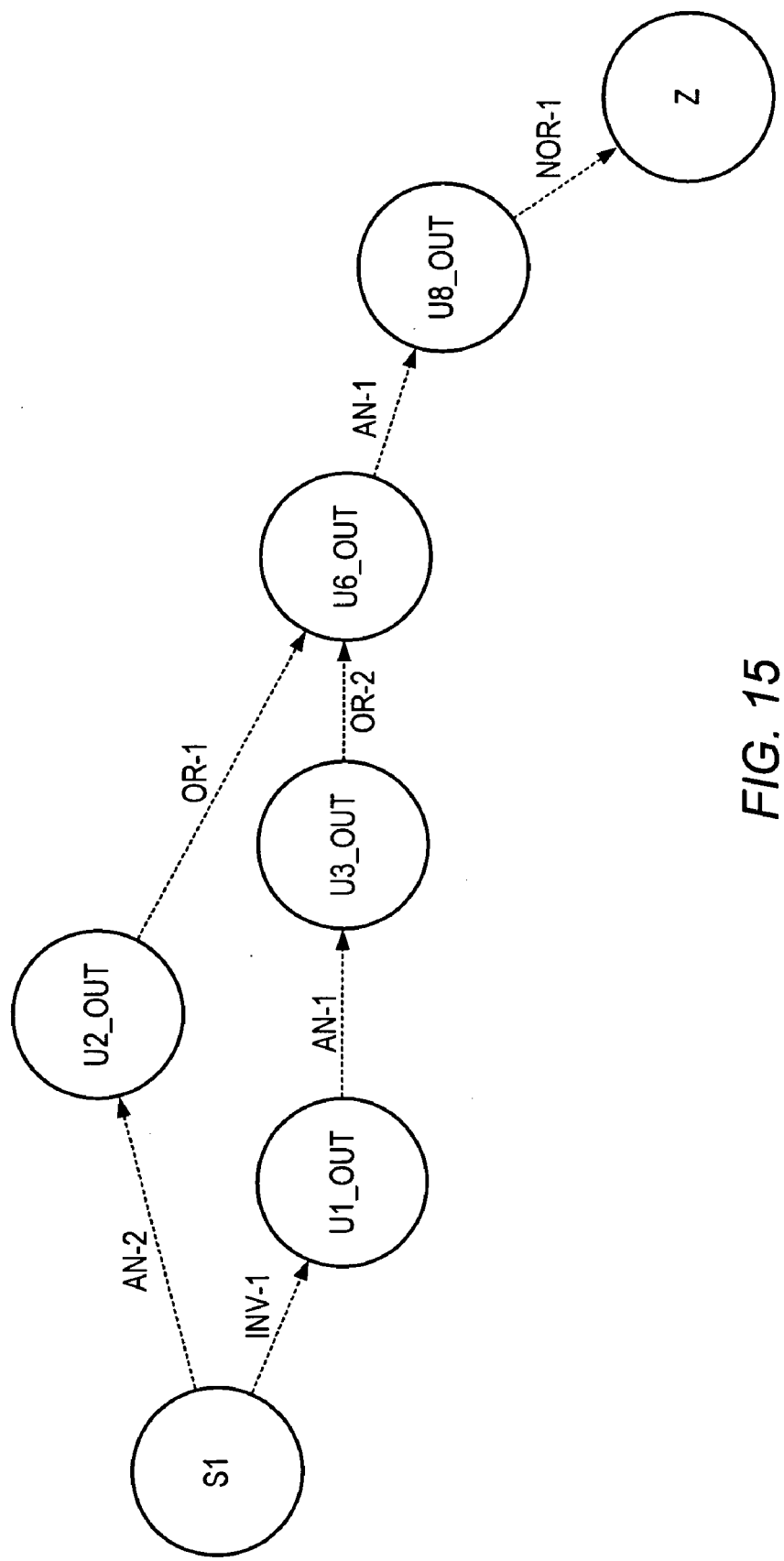
FIG. 15 depicts an example of an extracted composite path.

The following describes a recursive version of a sequence generation algorithm. To generate the sequence and directives for a path, the path-graph is first be extracted from the cone. FIG. 15 shows an example of an extracted composite path. Note that it is not necessary to explicitly extract the path-graph; a logical extraction will suffice. The explicit extraction is illustrated here to facilitate the description.

A few relatively simple rules are used to generate the arc sequence and directives using a forward traversal of the path-graph. The use of a forward traversal is performed because of the fully extracted path-graph. In instances where the path extraction is a "logical" or "virtual" nature, then a backward trace may be easier to implement. The various nuances of the various data structures and traversal techniques are not part of this discussion, as they are common for many graph-based algorithms, and fall within the knowledge and skill of persons of ordinary skill in the art who have the benefit of the description provided here.

The update index in the following discussion is an integer index into a vector of temporary results. An index is assigned for each net with more than one incoming edge (input arcs)—i.e., a convergent node. This storage location, indicated by the index, is updated for each store or update operation for the associated net.

The path sequence generation process begins with the following invocation:

```
net N = the input net;
Directives D;            //empty list of directives
Arcs arcs;               //empty list of arcs
int repeatCount = 0;
OPCODE preOp = NULL;
assign update-index to each net with more than one input edge;
Sequence(N, preOp, repeatCount, D, arcs);
``` which in turn invokes the following recursive subroutine:

```
sub Sequence(net N, OPCODE preOp, int repeatCount, Directives D, Arcs arcs)
{
    OPCODE postOp;
    numIn = number of inputs (N);      //incoming edges of N
    numOut = number of outputs (N);    //outgoing edges of N
    if (numIn greater than 1) {
        if (is NOT last incoming edge to N) {
            OPCODE postOp = UPDATE;
            if (is first incoming edge to N) postOp = STORE;
            add directive <preOp><repeatCount><postOp><upd-index>
            to D;
            return;
```

```
        }
        else {
            add directive <preOp><repeatCount>UPDATE<upd-index>
            to D;
            repeatCount = 0;
            preOp = LOAD;
        }
    }
    if (numOut equal 1) {
        N ← net connected to outgoing edge of N;
        Arcs ← arc for this edge;
        repeatCount = repeatCount + 1;
        Sequence(N, preOp, repeatCount, D);
    }
    else if (numOut greater than 1) {
        for (each outgoing edge of N) {
            if (first outgoing edge of N) {
                add directive <preOp><repeatCount>PUSH to D;
                preOp = NONE;
            }
            else if (last outgoing edge of N) preOp = POP;
            else preOp = PEEK;
            repeatCount = 1;
            N ← net attached to edge;
            Arcs ← arc for this edge;
            Sequence(N, preOp, repCount, D, arcs);
        }
    }
    else (add directive <preOp><repeatCount><NONE> to D; //the
    dependent
    output
}
```

Figure 16:
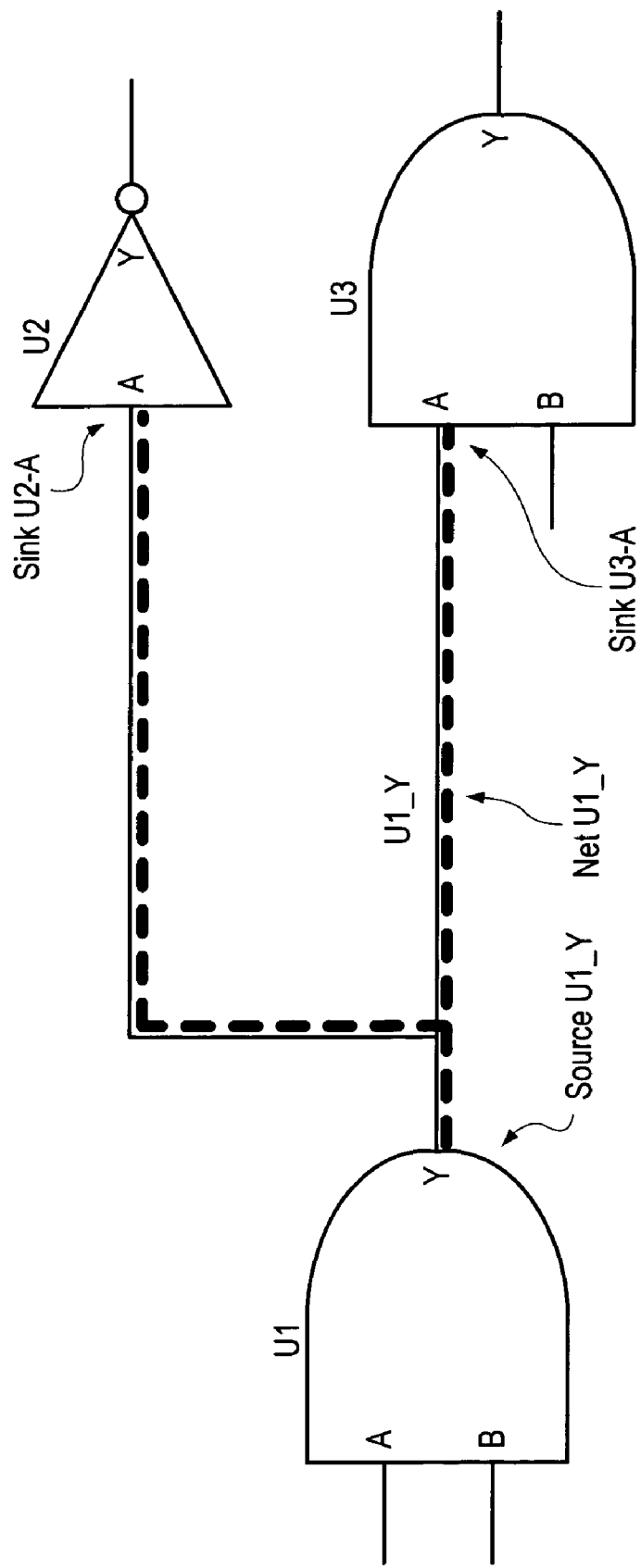
FIG. 16 shows an example of a net, driven by one source, and driving two sinks.

Nets are the conductive electrical interconnections or couplings between devices or components on an integrated circuit (IC). Generally, each net is driven by the output of a single device and drives the inputs of one or more other devices. The driver is referred to as a source. A device that is driven by the source is referred to as a sink. There may be many sinks per source. FIG. 16 shows an example of a net, driven by one source, and driving two sinks.

Nets are not electrically perfect. Between a source and each sink, there is an undesirable electrical resistance. Moreover, there is electrical capacitance between the source and various physical elements near the net. These elements include other distinct nets, other devices, and the semiconductor substrate, to name a few. Electrical inductance is also present, but is less important in today's devices.

Each of these undesirable electrical characteristics is called parasitic resistance, parasitic capacitance, and parasitic inductance, respectively. Compositely, these characteristics are designated simply as parasitics.

The electrical interplay between each of these parasitics negatively affects the performance of the IC in various ways, with the most undesirable being a reduction in the overall maximum speed. Historically, the parasitic capacitance has been the most problematic, since the delay from a device input to its output (intrinsic delay) increases in proportion to the load capacitance (on its output).

In addition, the same capacitance, distributed from the source to each sink through the resistance between each, also introduces a delay component from the source to each sink. The delay within the device is referred to as the intrinsic delay while the delay from the source to each sink is referred to as the parasitic delay. Each of these is dependent on the other.

The overall effect of parasitics can be substantial. As such, these effects should be accurately predicted. There have been various methods over the years to predict these delays, both independently and as a single entity. The description of the various methods falls within the scope of knowledge of persons of ordinary skill in the art. The enhancement described for CSTA is not dependent upon any specific method.

Each unique source-to-sink path is designated as a net arc and has a unique delay associated with it. Like the intrinsic device arcs, described above, each of the net arcs will have a method or algorithm that CSTA will invoke to predict the arc's delay and output transition time (source to the sink).

Figure 17:
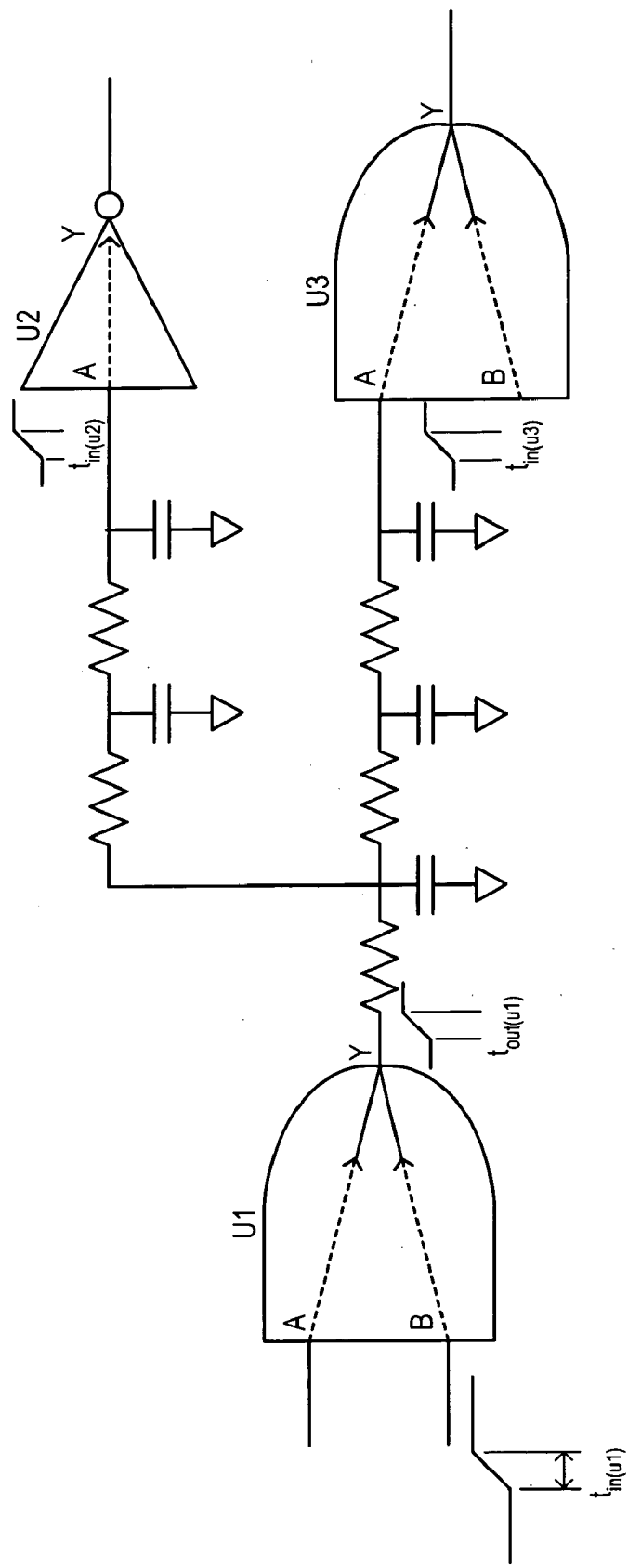
FIG. 17 illustrates an example of a circuit with interconnect parasitics represented as lumped resistance-capacitance (RC) circuits.

The delay for the net is dependent on the output transition time of the source and the affects of the parasitics. Normally, the parasitic effects are modeled initially as a lumped resistance-capacitance (RC) circuit connected between the source and each sink. FIG. 17 shows an example of a circuit with interconnect parasitics represented as lumped resistance-capacitance (RC) circuits. The interconnections from the source U1-Y to the dependent sinks U2-A and U3-A, is modeled as a single RC circuit.

Although not shown, inductors, including mutual inductors, could also be present in the parasitic model. As persons of ordinary skill in the art with the benefit of the description of the invention understand, however, there is no loss of generality because of that omission.

The delay from U1-A to U1-Y and the transition time at source pin U1-Y is dependent on the input transition time at input U1-B (assuming U1-A is held at a logic one) and the composite electrical load at output U1-Y. The composite load is modeled as the illustrated RC circuit. The delay from U1-Y to U2-A and U3-A and corresponding downstream input transition times, $t_{in(u2)}$ and $t_{in(u3)}$, are dependent upon $t_{out(u1)}$ and the RC circuit.

Figure 18:
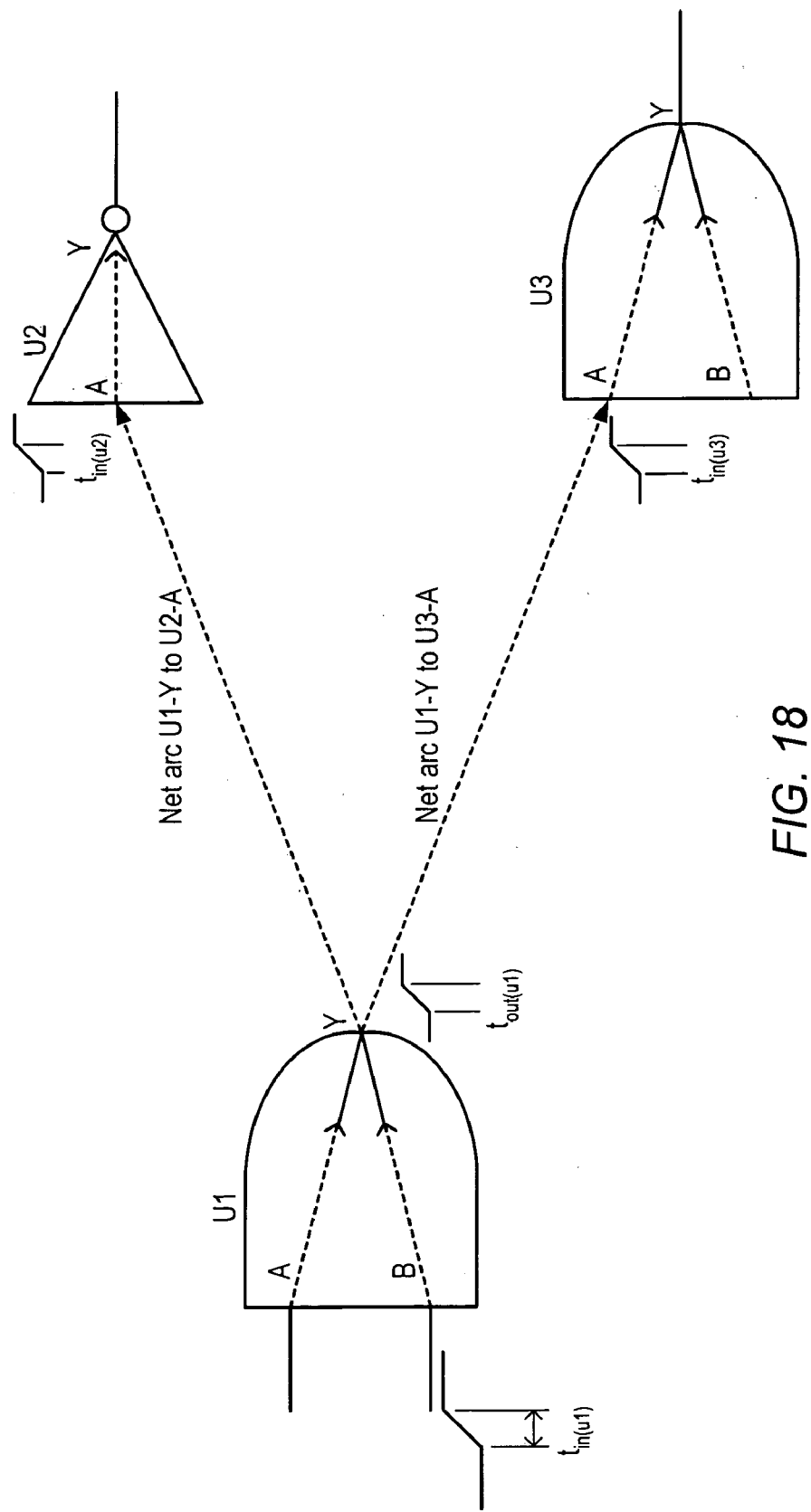
FIG. 18 depicts an example of a representation of net arcs corresponding to sources and sinks in a circuit.

Note there is a separate (net) path from source U1-Y to each sink. A unique arc is used to predict the delay and transition time for each path. In general if there are M sources and N sinks on the same net, then there will be M×N separate net arcs (normally M will be one). FIG. 18 shows an example of a representation of net arcs corresponding to sources and sinks in a circuit. Note that the figure illustrates the logical replacement of the detailed RC parasitics with two unique net arcs.

To avoid expensive calculations to estimate delay and transition time from an RC circuit, these circuits are usually preprocessed by specialized software to produce more efficient and smaller models for each net path, thus avoiding the direct use of RC circuits in the final net path model.

The final model used for the net paths is not important to CSTA, as the delay and transition times are calculated by an independent model algorithm, just as with devices. With no loss of generality, the various methods used to produce these models (from RC circuits or otherwise) are not considered here, as they fall within the skill and knowledge of persons of ordinary skill in the art who have the benefit of the description provided here.

Although net arcs are fundamentally the same as device arcs, they are different in one important aspect—there are a relatively large number of unique net arcs (perhaps thousands, tens of thousands, even hundreds of thousands times more than unique device arcs). Referring to FIG. 17, assume the two AND gates are of the same type and size. As such, the algorithm and corresponding data may be shared between the two different instantiations of the device. However, each net arc, in general, has its own independent arc-related data used to predict the delay and transition time. In a typical design, there may be, say, 200–1000 unique devices used, while there may be, say, 1,000,000 or more nets. Obviously, the storage of the net arc data uses considerably more storage than device arcs.

Normally, there is no practical way to really circumvent the issue of net arc storage. It is possible, however, to eliminate the need for some of these arcs by estimating (via the compiler) the relative delay of each arc as a fraction of estimated device delay. If the estimated maximum parasitic delay is small compared to the minimum expected device delay, then the parasitic information for net may be discarded. It is unlikely, however, that this will yield much benefit.

For small designs, there may be no negative consequences of the increased storage. For large designs, however, measures should typically be taken to reduce the storage. One of the aforementioned methods of storage reduction is the use of caching and sequential streaming from disk.

The CSTA compiler can predict the likely sequence the target application will request each device arc. This allows the compiler to sequence the arcs in an efficient order. Since net arcs are evaluated in the same order as the sinks to which they are connected, it can also sequence the nets in the same order. This ordering allows arcs to be streamed from disk in a very efficient manner, avoiding much of the random access memory (RAM) storage overhead, with a minimal impact on execution speed. It not only reduces the amount of storage, but also effectively amortizes the time to load data across the target application's execution window. Furthermore, it avoids the loading of data that is never used.

Another problem with net arcs, which may be perhaps more important, is the time that it takes to evaluate each net arc is generally greater than to evaluate a device arc (but now always). When using a path-based approach, the same arcs may be evaluated multiple times when arcs are shared between two or more composite paths. This problem is not unique to net arcs, but is more significant because net arcs tend to be more computationally more expensive. As with device arcs, the multiple evaluations of net arcs may be avoided by using cone-based evaluation techniques, as described above.

Figure 19:
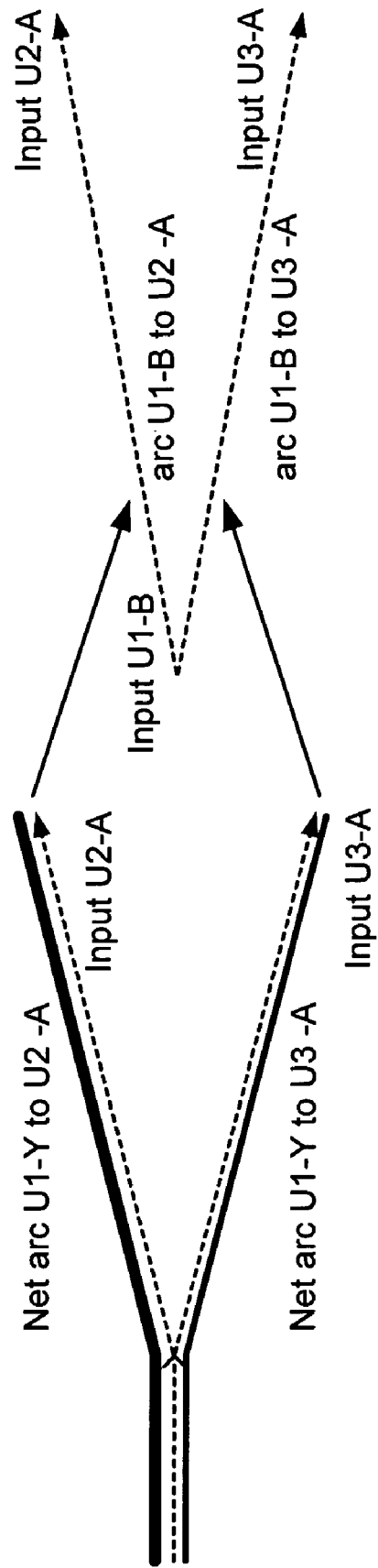
FIG. 19 shows an example of device/net-arc pre-characterization.

Sometimes previously designed and tested modules may be used on an IC without any changes to its physical design. This means the interconnections between devices on the module would be fixed and already known; hence the parasitics would also be the same. In this case, it is possible for the compiler to pre-characterize the parasitics and device together as a unit to optimize the computational efficiency of the model when used by the target application. This effectively eliminates one of the two arcs for each input-to-input path. FIG. 19 illustrates an example of device/net-arc pre-characterization.

The most direct method, and perhaps the most efficient, is to predict the delay from some input of a given device to each dependent sink. Delays from a given input to a dependent input on a subsequent device are calculated for a predetermined set of input transition times and then stored in a lookup table. The parasitics for each calculation are the same, resulting in a lookup table with a single dimension. This lookup table, along with a suitable lookup algorithm, is then used as the arc evaluator for the composite path from the input of the source device to a given dependent sink.

In effect, each device arc and a given net arc (to a dependent sink) are combined into a single arc, thus replacing the independent device arc and net arc. There will be a separate lookup table for each input-to-input combination. This method of arc elimination is known as arc folding.

Since the evaluation of one arc is eliminated, the overall evaluation will decrease. Furthermore, the storage used will also be reduced, since each path sequence will be decreased in length.

Figure 20:
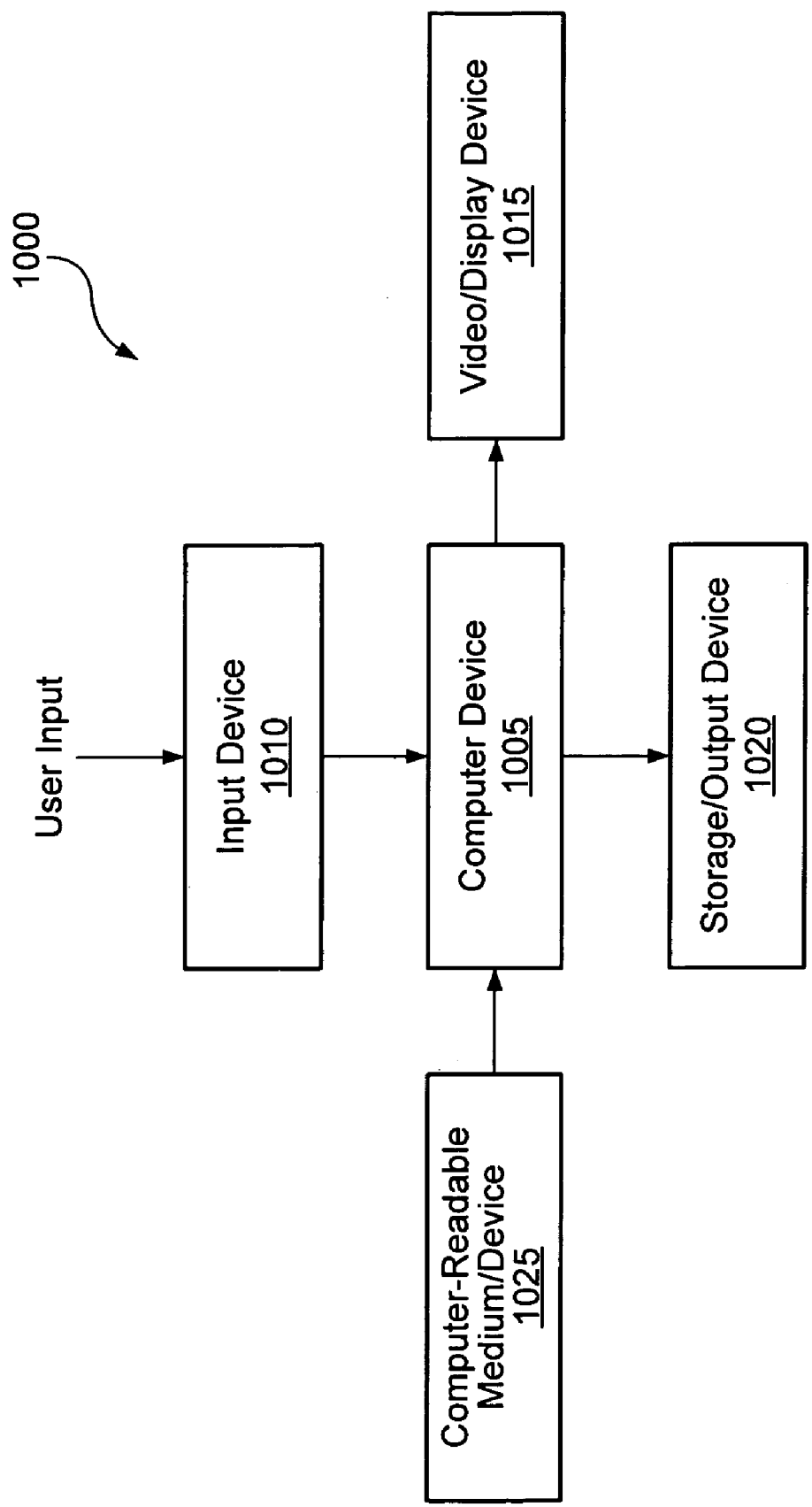
FIG. 20 illustrates a block diagram of a system for processing information and analyzing electronic circuitry according to the invention.

To characterize a given circuit design using the inventive concepts, one typically uses a computer system that processes information relating to that circuit. FIG. 20 shows a block diagram of a system 1000 for processing information and analyzing electronic circuitry according to the invention. The system 1000 includes a computer device 1005, an input device 1010, a video/display device 1015, and a storage/output device 1020, although one may include more than one of each of those devices, as desired. The computer device 1005 couples to the input device 1010, the video/display device 1015, and the storage/output device 1020. The system 1000 may include more that one computer device 1005, for example, a set of associated computer devices or systems, as desired.

The system 1000 operates in association with input from a user. The user input typically causes the system 1000 to perform specific desired information-processing tasks, including circuit analysis, characterization, and/or simulation. The system 1000 in part uses the computer device 1005 to perform those tasks. The computer device 1005 includes an information-processing circuitry, such as a central-processing unit (CPU), although one may use more than one CPU or information-processing circuitry, as persons skilled in the art would understand.

The input device 1010 receives input from the user and makes that input available to the computer device 1005 for processing. The user input may include data, instructions, or both, as desired. The input device 1010 may constitute an alphanumeric input device (e.g., a keyboard), a pointing device (e.g., a mouse, roller-ball, light pen, touch-sensitive apparatus, for example, a touch-sensitive display, or tablet), or both. The user operates the alphanumeric keyboard to provide text, such as ASCII characters, to the computer device 1005. Similarly, the user operates the pointing device to provide cursor position or control information to the computer device 1005.

The video/display device 1015 displays visual images to the user. The visual images may include information about the operation of the computer device 1005, such as graphs, pictures, images, and text. The video/display device may constitute a computer monitor or display, a projection device, and the like, as persons of ordinary skill in the art would understand. If a system uses a touch-sensitive display, the display may also operate to provide user input to the computer device 1005.

The storage/output device 1020 allows the computer device 1005 to store information for additional processing or later retrieval (e.g., softcopy), to present information in various forms (e.g., hardcopy), or both. As an example, the storage/output device 1020 may constitute a magnetic, optical, or magneto-optical drive capable of storing information on a desired medium and in a desired format. As another example, the storage/output device 1020 may constitute a printer, plotter, or other output device to generate printed or plotted expressions of the information from the computer device 1005.

The computer-readable medium 1025 interrelates structurally and functionally to the computer device 1005. The computer-readable medium 1025 stores, encodes, records, and/or embodies functional descriptive material. By way of illustration, the functional descriptive material may include computer programs, computer code, computer applications, and/or information structures (e.g., data structures or file systems). When stored, encoded, recorded, and/or embodied by the computer-readable medium 1025, the functional descriptive material imparts functionality. The functional descriptive material interrelates to the computer-readable medium 1025.

Information structures within the functional descriptive material define structural and functional interrelations between the information structures and the computer-readable medium 1025 and/or other aspects of the system 1000. These interrelations permit the realization of the information structures' functionality. Moreover, within such functional descriptive material, computer programs define structural and functional interrelations between the computer programs and the computer-readable medium 1025 and other aspects of the system 1000. These interrelations permit the realization of the computer programs' functionality.

By way of illustration, the computer device 1005 reads, accesses, or copies functional descriptive material into a computer memory (not shown explicitly in the figure) of the computer device 1005. The computer device 1005 performs operations in response to the material present in the computer memory. The computer device 1005 may perform the operations of processing a computer application that causes the computer device 1005 to perform additional operations. Accordingly, the functional descriptive material exhibits a functional interrelation with the way the computer device 1005 executes processes and performs operations.

Furthermore, the computer-readable medium 1025 constitutes an apparatus from which the computer device 1005 may access computer information, programs, code, and/or applications. The computer device 1005 may process the information, programs, code, and/or applications that cause the computer device 1005 to perform additional operations.

Note that one may implement the computer-readable medium 1025 in a variety of ways, as persons of ordinary skill in the art would understand. For example, memory within the computer device 1005 may constitute a computer-readable medium 1025, as desired. Alternatively, the computer-readable medium 1025 may include a set of associated, interrelated, or networked computer-readable media, for example, when the computer device 1005 receives the functional descriptive material from a network of computer devices or information-processing systems. Note that the computer device 1005 may receive the functional descriptive material from the computer-readable medium 1025, the network, or both, as desired.

Referring to the figures, persons of ordinary skill in the art will note that the various blocks shown may depict mainly the conceptual functions and signal flow. The actual circuit implementation may or may not contain separately identifiable hardware for the various functional blocks and may or may not use the particular circuitry shown.

For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the description of the invention understand.

Other modifications and alternative embodiments of the invention in addition to those described here will be apparent to persons of ordinary skill in the art who have the benefit of the description of the invention. Accordingly, this description teaches those skilled in the art the manner of carrying out the invention and are to be construed as illustrative only.

The forms of the invention shown and described should be taken as the presently preferred or illustrative embodiments. Persons skilled in the art may make various changes in the shape, size and arrangement of parts without departing from the scope of the invention described in this document. For example, persons skilled in the art may substitute equivalent elements for the elements illustrated and described here. Moreover, persons skilled in the art who have the benefit of this description of the invention may use certain features of the invention independently of the use of other features, without departing from the scope of the invention.

I claim:

1. A method comprising:
    receiving a description of a circuit comprising at least a first timing path, wherein the first timing path comprises a plurality of timing arcs;
    compiling a timing model for the circuit responsive to the description of the circuit, wherein the timing model comprises a description of the first timing path and one or more directives, wherein each directive corresponds to at least one of the plurality of timing arcs, and wherein the directives control evaluation of the plurality of timing arcs during an analysis of a design that includes the circuit; and
    analyzing the design that includes the circuit, wherein the analyzing comprises evaluating the timing model, and wherein evaluating the timing model comprises performing the one or more directives to evaluate the first timing path.

2. The method as recited in claim 1 wherein the description of the first timing path comprises a sequence of the plurality of timing arcs.

3. The method as recited in claim 1 wherein the one or more directives are executable.

4. The method as recited in claim 1 wherein the one or more directives are interpreted by a sequence evaluator, wherein performing the one or more directives comprises invoking the sequence evaluator.

5. The method as recited in claim 1 further comprising:
    changing the design but not changing the circuit; and
    analyzing the changed design, the analyzing comprising reusing the timing model for the circuit.

6. The method as recited in claim 1 wherein the circuit comprises a plurality of logic elements, and wherein the compiling comprises discarding details of the plurality of logic elements.

7. The method as recited in claim 1 further comprising compiling another timing model of another circuit, wherein the other circuit instantiates the circuit at least once, and wherein the other timing model is a hierarchical model that instantiates the timing model.

8. The method as recited in claim 1 wherein one or more of the plurality of timing arcs are net arcs.

9. A computer readable medium comprising a plurality of instructions which, when executed:
    read a description of a circuit comprising at least a first timing path, wherein the first timing path comprises a plurality of timing arcs;
    compile a timing model for the circuit responsive to the description of the circuit, wherein the timing model comprises a description of the first timing path and one or more directives, wherein each directive corresponds to at least one of the plurality of timing arcs, and wherein the directives control evaluation of the plurality of timing arcs during an analysis of a design that includes the circuit.

10. The computer readable medium as recited in claim 9 wherein the plurality of instructions, when executed, analyze the design that includes the circuit, wherein analyzing the design comprises evaluating the timing model, and wherein evaluating the timing model comprises performing the one or more directives to evaluate the first timing path.

11. The computer readable medium as recited in claim 9 wherein the description of the first timing path comprises a sequence of the plurality of timing arcs.

12. The computer readable medium as recited in claim 9 wherein the circuit comprises a plurality of logic elements, and wherein the compiling comprises discarding details of the plurality of logic elements.

13. The computer readable medium as recited in claim 9 wherein the plurality of instructions, when executed, compile another timing model of another circuit, wherein the other circuit instantiates the circuit at least once, and wherein the other timing model is a hierarchical model that instantiates the timing model.

14. A computer readable medium comprising a plurality of instructions which, when executed:
    receive a timing model of a circuit, wherein the timing model comprises a description of a first timing path in the circuit, and wherein the first timing path comprises a plurality of timing arcs, and wherein the timing model further comprises one or more directives, wherein each directive corresponds to at least one of the plurality of timing arcs, and wherein the directives control evaluation of the plurality of timing arcs during an analysis of a design that includes the circuit; and
    analyze a design that includes the circuit, wherein the analyzing comprises evaluating the timing model, and wherein evaluating the timing model comprises performing the one or more directives to evaluate the first timing path.

15. The computer readable medium as recited in claim 14 wherein performing the algorithm comprises interpreting the one or more directives.

16. The computer readable medium as recited in claim 14 wherein the description of the first timing path comprises a sequence of the plurality of timing arcs.

* * * * *